(12) United States Patent
Kim et al.

(10) Patent No.: US 8,878,275 B2
(45) Date of Patent: Nov. 4, 2014

(54) LDMOS DEVICE WITH DOUBLE-SLOPED FIELD PLATE

(71) Applicant: Fairchild Semiconductor Corporation, San Jose, CA (US)

(72) Inventors: Sunglyong Kim, Falmouth, ME (US); Mark Schmidt, Falmouth, ME (US); Christopher Nassar, Portland, ME (US); Steven Leibiger, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/769,661

(22) Filed: Feb. 18, 2013

(65) Prior Publication Data

US 2014/0231911 A1 Aug. 21, 2014

(51) Int. Cl.
- *H01L 27/108* (2006.01)
- *H01L 29/76* (2006.01)
- *H01L 29/94* (2006.01)
- *H01L 31/119* (2006.01)
- *H01L 29/66* (2006.01)
- *H01L 29/78* (2006.01)

(52) U.S. Cl.
CPC ...... *H01L 29/7816* (2013.01); *H01L 29/66681* (2013.01)
USPC ........... 257/310; 257/350; 257/359; 257/368; 257/377; 257/E21.006; 257/E21.027; 257/E21.042; 257/E21.045; 257/E21.051; 257/E21.058; 257/E21.079; 257/E21.082; 257/E21.165; 257/E21.253; 257/E21.254; 257/E21.267; 257/E21.324; 257/E21.421

(58) Field of Classification Search
USPC ......... 257/310, 350, 368, 272, 262, 274, 321, 257/322, 341, 377, 359, E21.006, E21.027, 257/E21.042, E21.051, E21.058, E21.079, 257/E21.082, E21.165, E21.253, E21.254, 257/E21.267, E21.324, E21.421
See application file for complete search history.

(56) References Cited

U.S. PATENT DOCUMENTS

| | | | | |
|---|---|---|---|---|
| 7,050,138 | B1 * | 5/2006 | Yamazaki et al. | 349/152 |
| 7,361,519 | B2 * | 4/2008 | Yamazaki et al. | 438/26 |
| 7,838,328 | B2 * | 11/2010 | Isa | 438/99 |
| 2008/0073746 | A1 | 3/2008 | Tanaka | |
| 2011/0248341 | A1 * | 10/2011 | Ring | 257/335 |
| 2013/0234241 | A1 * | 9/2013 | Bowers | 257/330 |

OTHER PUBLICATIONS

Kitamura, Akio et al., "Self-Isolated and High Performance Complementary Lateral DMOSFETs with Surrounding-Body Regions", Proceedings of 1995 International Symposium on Power Semiconductor Devices & ICs, Yokohama, pp. 42-47.

* cited by examiner

Primary Examiner — David Nhu
(74) Attorney, Agent, or Firm — Brake Hughes Bellermann LLP

(57) ABSTRACT

In one general aspect, an apparatus can include a channel region disposed in a semiconductor substrate, a gate dielectric disposed on the channel region and a drift region disposed in the semiconductor substrate adjacent to the channel region. The apparatus can further include a field plate having an end portion disposed between a top surface of the semiconductor substrate and the gate dielectric The end portion can include a surface in contact with the gate dielectric, the surface having a first portion aligned along a first plane non-parallel to a second plane along which a second portion of the surface is aligned, the first plane being non-parallel to the top surface of the semiconductor substrate and the second plane being non-parallel to the top surface of the semiconductor substrate.

17 Claims, 17 Drawing Sheets

NORMALIZED COMPARISON OF LDMOS WITH DOUBLE-SLOPED (DRIFT) FIELD PLATE AND LDMOS WITH LOCOS (DRIFT) FIELD PLATE

300

|  | Bvoff (V) | Bvon (V) | Ron.sp (mohm/mm^2) |
|---|---|---|---|
| Conv (Std. Dose) | 1.044 | 0.884 | 1.049 |
| New (Std. Dose+25%) | 1.036 | 1.0 | 1.0 |
| Improvement | -0.89% | 13.08% | 4.75% |

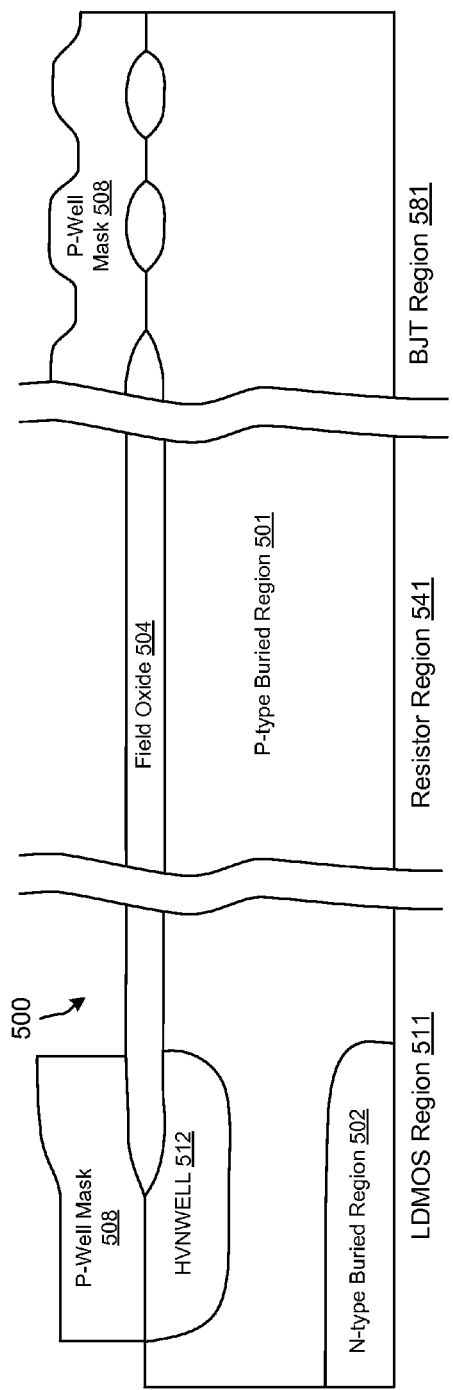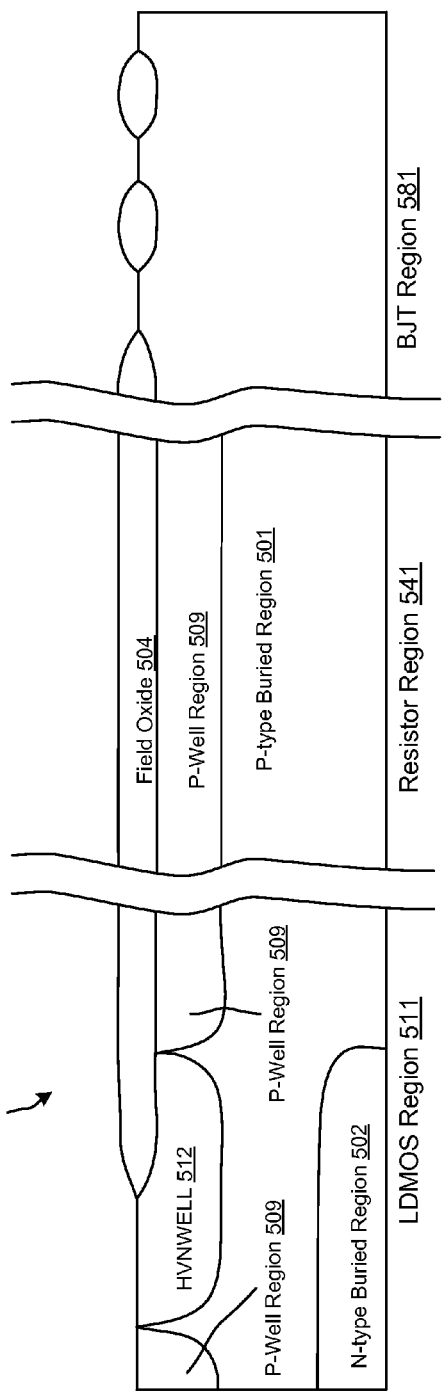
FIG. 5B
FIG. 5C

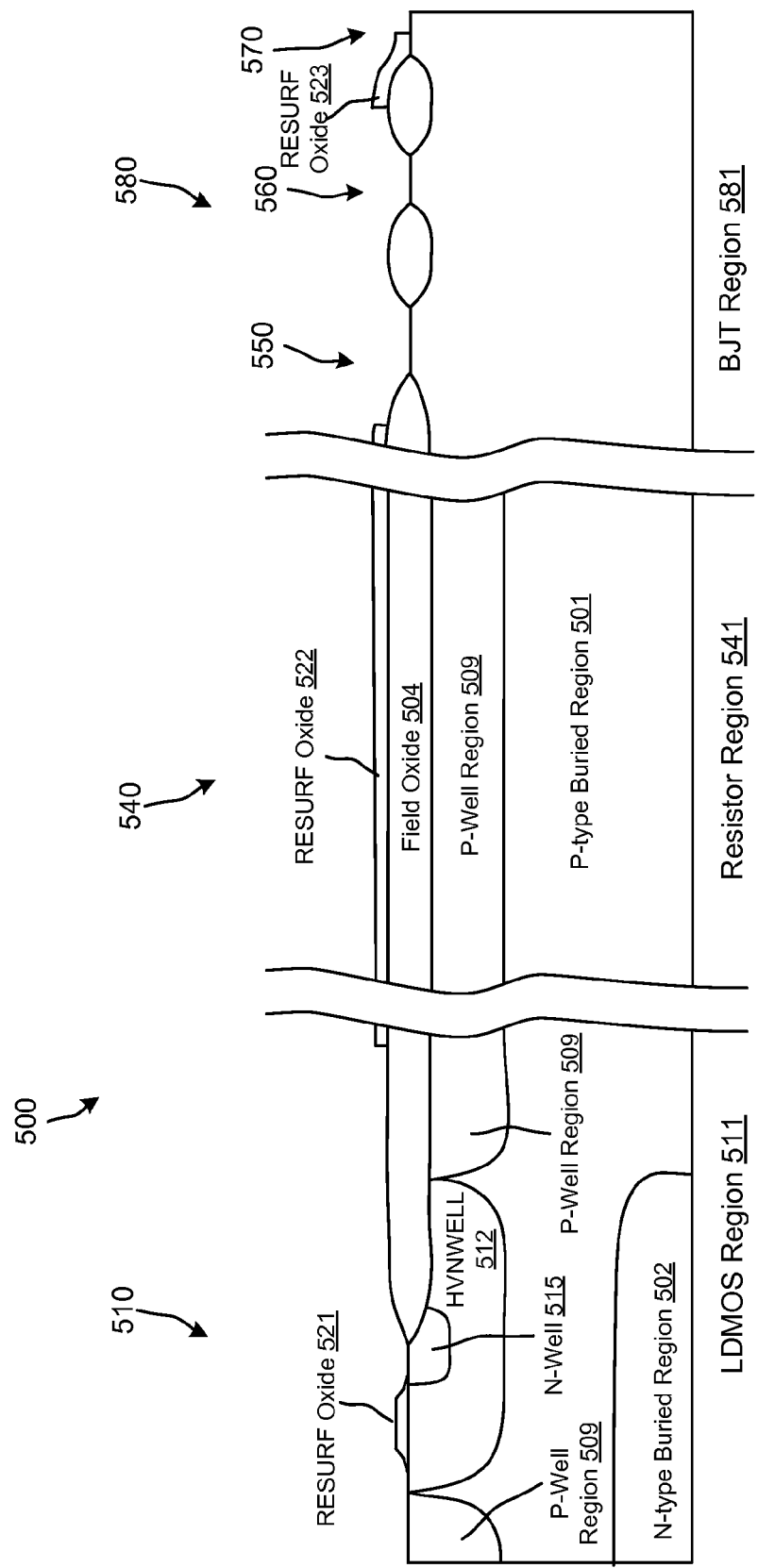

US 8,878,275 B2

LDMOS DEVICE WITH DOUBLE-SLOPED FIELD PLATE

TECHNICAL FIELD

This description relates to laterally diffused metal oxide semiconductor transistors and methods for forming the same.

BACKGROUND

Designing and engineering transistors for production using semiconductor processes typically involves trading off one or more performance parameters for one or more other performance parameters. Such performance parameters may include drain to source on resistance (Rdson), off breakdown voltage (BVoff) and on breakdown voltage (BVon), as some examples. For instance, in a laterally diffused metal-oxide-semiconductor (LDMOS) transistor, a dopant dose in a drift region (drift dose or DD) may be changed to modify the Rdson of a given LDMOS transistor. For example, increasing the drift dose of a semiconductor process used to produce a given LDMOS transistor will reduce the Rdson for that transistor as compared to an LDMOS transistor with the same physical configuration that is produced using a lower drift dose.

However, increasing the drift dose for a given LDMOS transistor may also reduce the BVon and/or the BVoff of the transistor, which may be undesirable. For example, increasing the drift dose used for a given transistor may cause an increase in electric field crowding (e.g., at a top surface of a silicon substrate) at a boundary between a gate dielectric of the transistor and field oxide formed using local-oxidation of silicon (LOCOS) disposed in the semiconductor substrate in a drift region of the transistor. This increase in electrical field crowding may reduce the breakdown voltages of the given transistor (BVon and BVoff), causing breakdown of the give transistor to occur at (or near) the gate dielectric and field oxide boundary at lower voltages than in the given transistor when a lower drift dose is used. Accordingly, improvements in Rdson are traded off for lower BVon and BVoff. As performance requirements for semiconductor devices increase, producing transistors that have acceptable Rdson values and acceptable breakdown voltage values may not be achievable using current approaches.

SUMMARY

In one general aspect, a laterally diffused metal oxide semiconductor (LDMOS) transistor can include a source region disposed in a semiconductor substrate, a drain region disposed in the semiconductor substrate and a channel region disposed in the semiconductor substrate between the source region and the drain region. The LDMOS transistor can also include a drift region disposed in the semiconductor substrate between the channel region and the drain region, a field dielectric plate disposed on the semiconductor substrate over at least a portion of the drift region and a gate electrode disposed on at least a portion of the field dielectric plate. The field plate can include a first portion having a surface in contact with the gate electrode, the surface of the first portion having a first slope relative to a surface of the semiconductor substrate and a second portion disposed on the first portion and having a surface in contact with the gate electrode, the surface of the second portion having a second slope relative to the surface of the semiconductor substrate, the second slope being different than the first slope.

The details of one or more implementations are set forth in the accompanying drawings and the description below. Other features will be apparent from the description and drawings, and from the claims.

BRIEF DESCRIPTION OF THE DRAWINGS

FIGS. 5A through 5M are diagrams that illustrate cross-sectional views of at least some process steps in a semiconductor process.

DETAILED DESCRIPTION

The disclosure herein is related to semiconductor devices, such as laterally diffused metal-oxide-semiconductor (LDMOS) transistors, with double-sloped field plates (which may also be referred to as a field dielectric plate or a drift field dielectric). The disclosure herein is further related to corresponding methods for producing such semiconductor devices. Such LDMOS devices, with a double-sloped field plate, may be produced with an increased drift dose (to decrease Rdson), while also having similar or improved breakdown voltage performance as compared to conventional LDMOS transistors that include, for example, drift field oxide formed using local oxidation of silicon (LOCOS).

Additionally, using the semiconductor processing methods described herein, semiconductor devices (e.g., other than LDMOS transistors) can be produced using one or more process steps within a semiconductor process overlapping or corresponding with one or more process steps used to produce other semiconductor devices (e.g., LDMOS transistors). For example, a process step that is used to produce a portion of a first semiconductor device can also be used to produce a portion of a second semiconductor device. In other words, the same process step can be used to produce different portions of different semiconductor devices within an integrated circuit. The process step, which can be a process step that is used to produce the portion of the first semiconductor device, may be used, in an unexpected fashion, to produce the portion of the second semiconductor device.

The disclosure herein can be related to processes used to produce a variety of devices including polysilicon resistors, capacitors, bipolar junction transistor (BJT) devices (e.g., NPN BJT devices, PNP BJT devices), complementary metal-oxide semiconductor (CMOS) devices (e.g., P-type metal oxide semiconductor field effect transistor (MOSFET) (PMOSFET or PMOS) devices, N-type MOSFET (NMOSFET or NMOS) devices), laterally diffused metal oxide semiconductor (LDMOS) devices (e.g., N-type LDMOS (LND- MOS) devices, P-type LDMOS (LPDMOS) devices), and/or so forth. A semiconductor process including at least BJT devices, CMOS devices, LDMOS devices can be referred to as a BCDMOS process.

Figure 1:
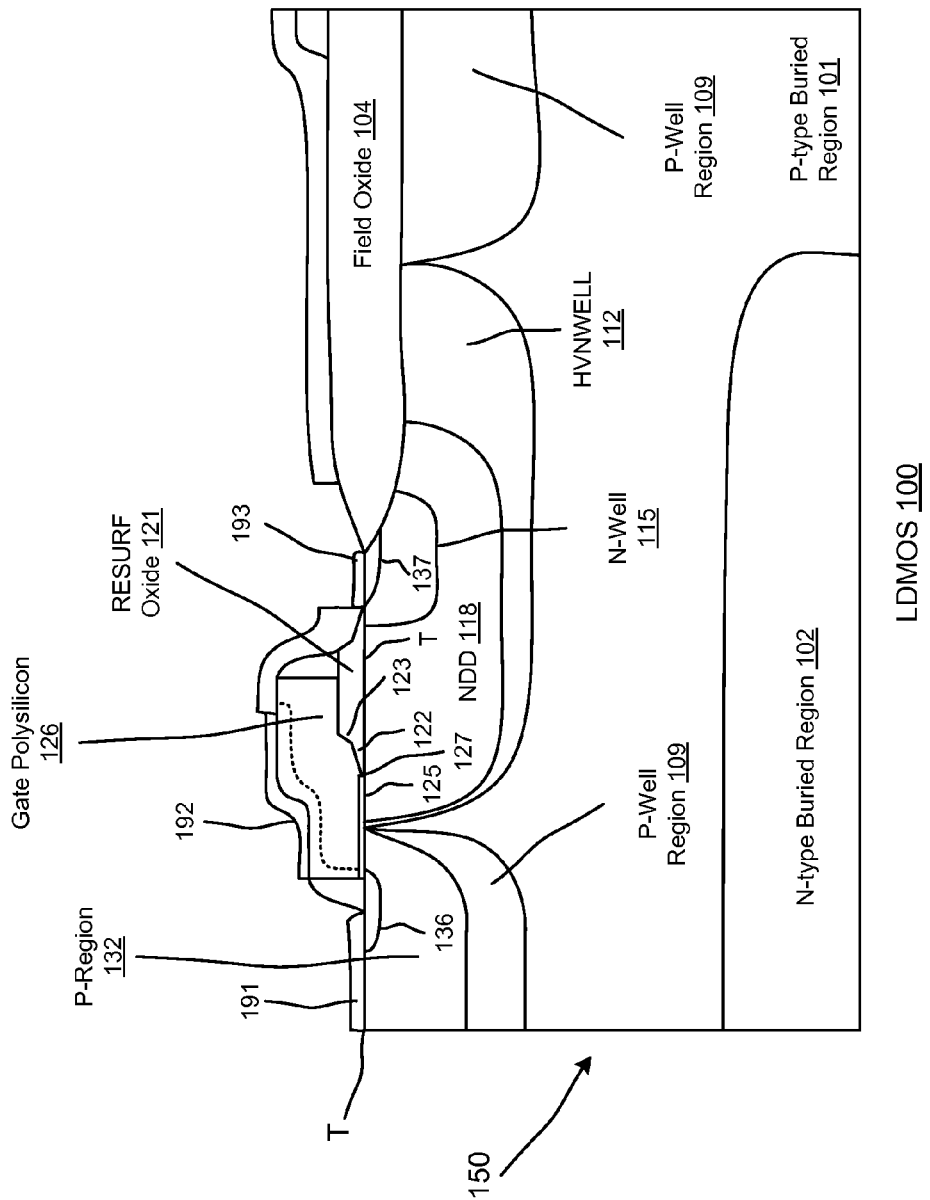
FIG. 1 is a diagram that illustrates a side cross-sectional view of a laterally diffused metal-oxide-semiconductor (LDMOS) transistor 100, according to an embodiment.

FIG. 1 is a diagram that illustrates a side cross-sectional view of a laterally diffused metal-oxide-semiconductor (LDMOS) device 100, according to an embodiment. The LDMOS device 100 shown in FIG. 1 includes a high voltage (HV) N-type LDMOS (HV LNDMOS) transistor. While not shown, a HV P-type LDMOS (NV LPDMOS) transistor may be formed using a similar configuration as the LDMOS device 100 shown in FIG. 1. In an example embodiment, the LDMOS device 100 may be formed using semiconductor process steps described herein, such as those illustrated and discussed with respect to FIGS. 2A-2E and 5A-5M below. For purposes of clarity and brevity, those process steps are not described in detail with respect to FIG. 1 and the description of FIG. 1 discusses various features of the LDMOS device 100 without addressing each of the specific processing details used to form those features. In other embodiments, other semiconductor processing steps may be used to produce the LDMOS device 100.

As shown in FIG. 1, the LDMOS device 100 may be formed in a substrate 150 that includes a P-type buried layer 101. The P-type buried layer 101 may be formed, for example, as an epitaxial layer. The LDMOS device 100 also includes an N-type buried region 102 that is formed in the P-type buried layer 101. The LDMOS device 100 further includes a field oxide 104 that may be formed using a local oxidation of silicon (LOCOS) process, such as in the manners described herein.

The LDMOS device 100 also includes a number of well regions, P-type silicon regions, and N-type silicon regions. For instance, the LDMOS device 100 includes P-well regions 109, a HV N-well (HVNWELL) region 112, an N-Well region 115, and an N-type doped drift (NDD) region 118. The LDMOS device 100 still further includes a P-region 132 (which may be used as a body region of the LDMOS device 100), an N-type source region 136 and an N-type drain region 137. The LDMOS device 100 also further includes a gate dielectric (e.g., high-quality gate oxide) 125 and a polysilicon gate electrode 126.

As illustrated in FIG. 1, the LDMOS 100 also includes salicides 191, 192 and 193, which may be used to form ohmic contacts with various features of the LDMOS 100. For instance, the salicide 191 may form an ohmic contact to the body region (P-region 132) and the source region 136 of the LDMOS 100. The salicide 192 may form an ohmic contact with the gate polysilicon 126. The salicide 193 may form an ohmic contact with the drain region 137 of the LDMOS device 100. Additional interconnect layers, such as metallization layers, contact and vias may be disposed on (or electrically coupled with) the salicide 191, 192 and 193 to provide electrical connectivity to the terminals of the LDMOS device 100 for other circuit elements, or to connect the terminals (source region 136 and drain region 137) of the LDMOS device 100 with corresponding terminals of a power supply.

The LDMOS device 100 also includes a RESURF oxide 121, which is used to form a double-sloped field plate (which may also be referred to as, for example, a drift region dielectric plate or a drift region field dielectric) 121. The RESURF oxide may be formed using the techniques described herein. As shown in FIG. 1, the RESURF oxide (field plate) 121 includes a first portion that includes a surface 122 in contact with the gate electrode 126. The surface 122 of the first portion has a first slope relative to a surface of the semiconductor substrate of the LDMOS device 100. The RESURF oxide 121 also includes a second portion that is disposed on the first portion, where the second portion includes a surface 123 that is also in contact with the gate electrode 126. The surface 123 of the second portion of the RESURF oxide 121 has a second slope relative to the top surface T of the substrate 150, where the second slope is different than the first slope.

The field plate (e.g., RESURF oxide 121) of the LDMOS device 100 may be described as having an end portion (including the surfaces 122, 123) that is disposed between the top surface of the semiconductor substrate and the gate electrode 126. In certain embodiments, the gate dielectric 125 may also be disposed between the top surface of the semiconductor substrate and the gate electrode 126 (e.g., disposed between the end portion of the field plate and the gate electrode). The end portion of the field plate may be described as having the surface of its end portion in contact with the gate electrode 126 (or the gate dielectric 125), where the surface includes a first portion (122) aligned along a first plane that is non-parallel to a second plane along which a second portion (123) of the surface is aligned. In the LDMOS device 100, the first plane is non-parallel to the top surface of the semiconductor substrate and the second is also non-parallel to the top surface of the semiconductor substrate. As shown in FIG. 1, an opposite end of the RESURF oxide (field plate) 121 (in contact with the drain region 137) may also include a double sloped end portion that is of substantially similar configuration as the end portion that is in contact with the gate dielectric 125 and/or the gate electrode 126.

In the LDMOS 100, the arrangement of the end portion (double-sloped end portion) of the RESURF oxide 121 (drift field plate) disposed between the top surface of the substrate 150 and the gate electrode 126 results in a reduction in electric field crowding at the interface 127 between the gate dielectric 125 and the RESURF oxide 121 (e.g., on the surface of the silicon substrate 150 where the slope of the first surface 122 begins) as compared with the interface between a gate dielectric and a field oxide drift region dielectric in conventional LDMOS devices. In certain embodiments, this reduction in electric field crowding results in the breakdown point for the LDMOS device 100 to moving from the vicinity of the interface between the gate dielectric 125 and the field plate into the bulk of the LDMOS device 100, which may cause a corresponding increase in the breakdown voltages (BVon and BVoff). Moving the breakdown point of LDMOS device 100 into the bulk allows for the NDD region 118 dopant dose to be increased in order to reduce Rdson of the LDMOS 100 as compared with conventional LDMOS device, without that increase in NDD dopant dose causing an unacceptable reduction in breakdown voltages. An example of such improvements is discussed in further detail below with respect to FIG. 3.

FIGS. 2A-2E are diagrams that illustrate cross-sectional views of at least some process steps for producing an LDMOS device 200 including a double-sloped field plate (e.g., for a drift region of an LDMOS device), according to an embodiment. The process steps shown in FIGS. 2A-2E may be used when producing the LDMOS device 100 shown in FIG. 1, as well as to produce features of other semiconductor devices, such as described herein.

Figure 2A:
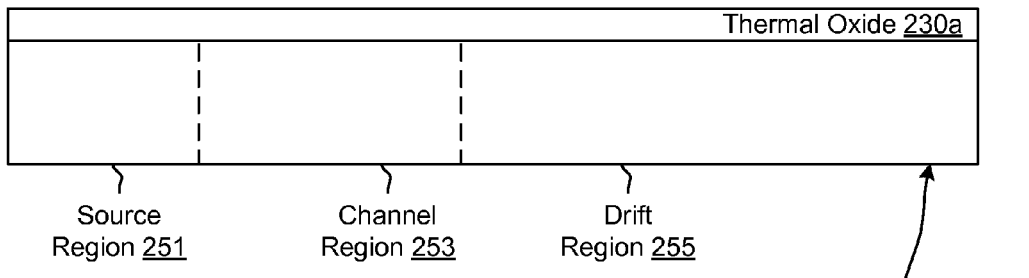
FIGS. 2A-2E are diagrams that illustrate cross-sectional views of at least some process steps for producing a double-sloped field plate, according to an embodiment.

In FIG. 2A, the LDMOS 200 includes a silicon substrate 250 that includes a source region 251, a channel region 253 and a drift region 255 defined therein. While not shown, the LDMOS 200 may also include a drain region that is defined in the substrate 250. In order to simplify FIGS. 2A through 2E, the source region 251, the channel region 253 and the drift region 255 are shown in the abstract without specific details of their individual features. These regions (and a corresponding drain region) may be formed using a number of masking, etching and/or deposition processes, as well as other semiconductor manufacturing techniques. For instance, the approaches described below with respect to FIGS. 5A thorough 5M may be used to form the source region 251, the channel region 253, the drift region 255 and the drain region (not shown) of the LDMOS device 200.

Figure 2B:
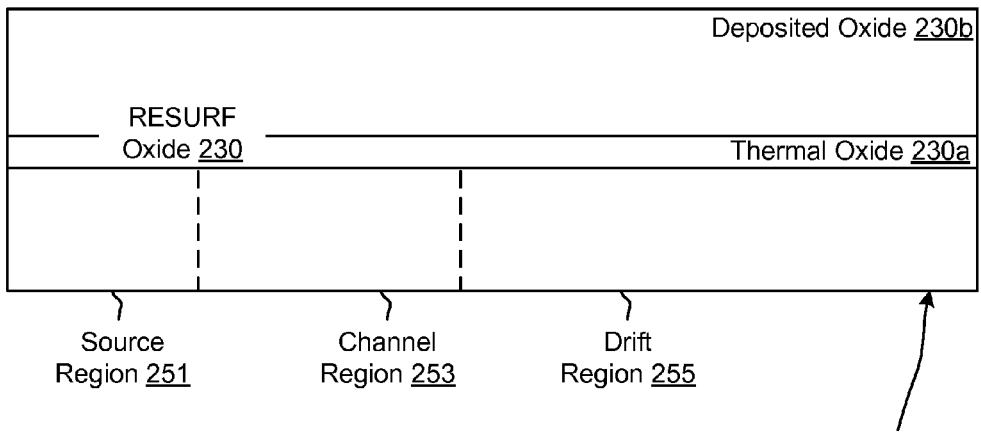

As illustrated in FIG. 2A, a first dielectric layer is formed on the silicon substrate 250. The first dielectric layer in the LDMOS 200 includes a thermally grown oxide layer 230a, which may be used as a first layer of a RESURF oxide in some embodiments. As shown in FIG. 2B, a second dielectric layer may be formed on the thermal oxide 230a. The second dielectric layer in the LDMOS device 200 includes a deposited oxide 230b. The thermal oxide 230a and the deposited oxide 230b form the RESURF oxide 230 of the LDMOS 200. In the LDMOS 200, the thermal oxide 230a may be disposed directly on the silicon substrate 250 and the deposited oxide 230b may be disposed directly on the thermal oxide 230a. In an embodiment of an LDMOS device, such as the LDMOS 100, that is formed using the RESURF oxide 230, the second dielectric layer (the deposited oxide 230b) may be disposed (vertically) between the first dielectric layer (the thermal oxide 230a) and a gate electrode (the gate polysilicon 126) of the LDMOS device.

The materials used to form the RESURF oxide 230 and the arrangement of those materials will depend on the specific implementation. For instance, in one embodiment, the deposited oxide 230b may be at least four times as thick as the thermal oxide 230a. In other implementation, the ratio of thicknesses of the oxides may be higher, lower or reversed. Additionally the order in which the oxides are formed (grown or deposited) may be changed. In embodiments such as illustrated in FIG. 2A-2E, the deposited oxide 230b may have an etch rate that is greater than an etch rate of the thermal oxide 230a for a same etchant species. For instance, the ratio of an etch rate of the thermal oxide 230a to an etch rate of the deposited oxide 230b may be on the order of 1:30, though other etch rate ratios are possible, such as 1:10, 1:20, 1:40, and so on. In other embodiments, different materials with different etch rate rates (ratios) may be used. In some embodiments, the deposited oxide 230b may include a deposited oxide layer derived from a tetraethylorthosilicate (TEOS) precursor (e.g., a TEOS layer), a densified, deposited oxide, an undensified, deposited oxide, a nitride layer and/or an oxide formed using a number of different types of chemical vapor deposition processes. In other embodiments, still other dielectric materials may be used to form the RESURF oxide 230.

Figure 2C:
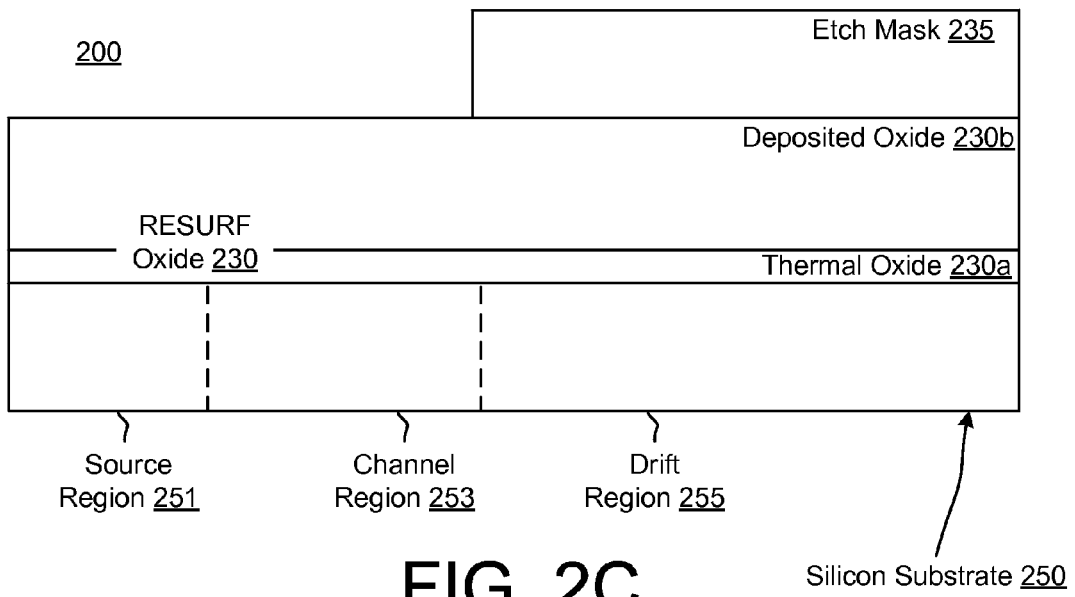
Figure 2D:
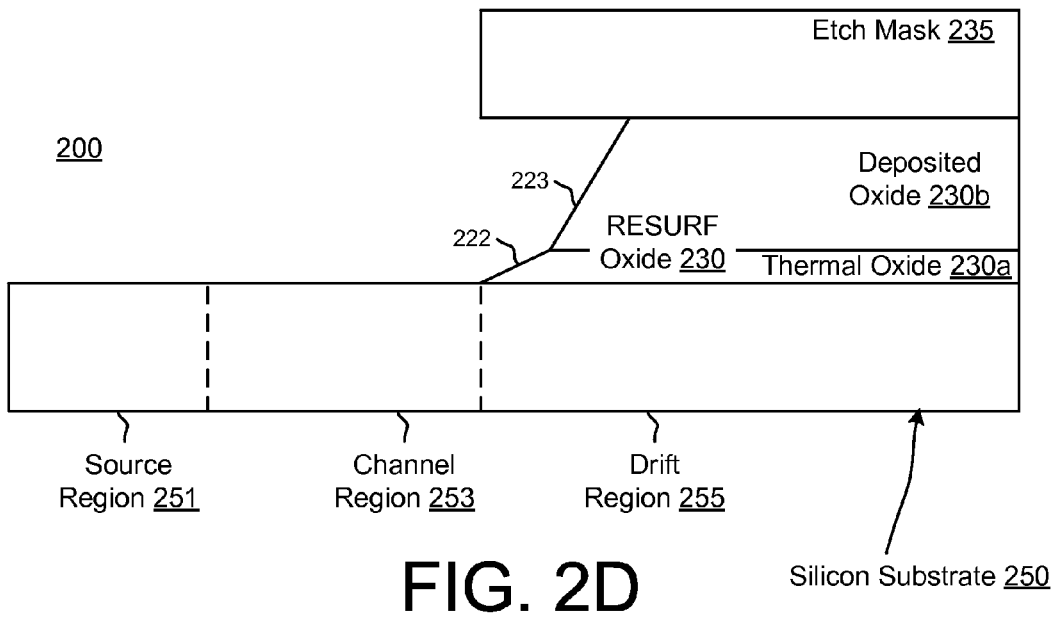

As shown in FIG. 2C, an etch mask 235 is formed on the surface of the deposited oxide 230b (on the RESURF oxide 230). As described herein, the etch mask 235 may be formed using a number of approaches. For example, the etch mask 235 may be formed using photolithography and/or using a blocking layer, such as a nitride layer, for example. After forming the etch mask 235, the RESURF oxide 230 may be etched through an opening in the etch mask 235 using, for example, a buffered-oxide etch (BOE) process to form a double-sloped drift field plate, such as discussed herein. This etch process, produces the double-sloped end portion of the RESURF oxide 230 shown in FIG. 2D as result of, at least, over-etching the deposited oxide 230b due to the difference in etch rates between the deposited oxide 230b and the thermal oxide 230a. As illustrated in FIG. 2D, the double-sloped end portion of the RESURF oxide 230 includes a first surface 222 and a second surface 223, where the first surface 222 is formed from the thermal oxide 230a and the second surface 223 is formed from the deposited oxide 230b.

Figures 2E, 3:
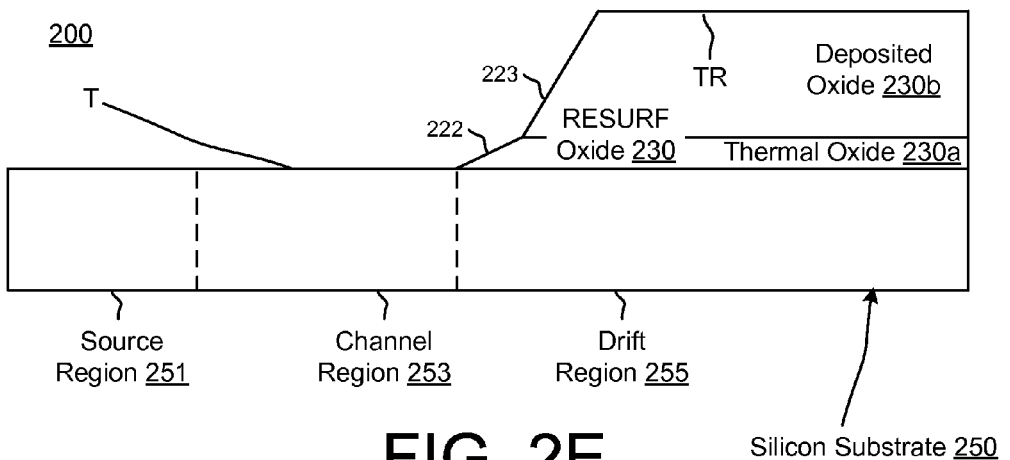
FIG. 3 is a table illustrating a comparison of performance parameters for a conventional LDMOS transistor with performance parameters for a LDMOS transistor including a double-sloped field plate, according to an embodiment.

After performing the etch process of FIG. 2D, the etch mask 235 may be removed as shown in FIG. 2E. As illustrated in FIG. 2E, the first surface 222 has a first slope that is nonparallel with the surface of the silicon substrate 250 and is non-orthogonal with the surface of the silicon substrate 250. As also illustrated in FIG. 2E, the second surface 223 has a second slope that is nonparallel with the surface of the silicon substrate 250 and is non-orthogonal with the surface of the silicon substrate 250. As shown in FIG. 2E, the first slope of the first surface 222 begins at a boundary between the channel region and the drift region of the LDMOS 200, while the second slope of the second surface 223 begins at a top of the first slope of the first surface 223.

In the LDMOS 200, as illustrated in FIG. 2E, the double-sloped end portion of the RESURF oxide 230 (the combination of the surfaces 222 and 223) may be referred to as a single surface that has a first portion aligned along a first plane non-parallel to a second plane along which a second portion of the surface is aligned. In this example, the first plane may be described as being non-parallel to the top surface of the silicon substrate 250 and the second plane may be described as also being non-parallel to the top surface of the silicon substrate 250.

In the LDMOS 200, the first plane of the first portion of the surface defines a first angle with respect the top surface of the silicon substrate 250 and the second plane of the second portion of the surface defines a second angle with respect the top surface of the silicon substrate 250, where the first angle is less than the second angle. In other embodiments, the first angle may be greater than the second angle. In other words, in the LDMOS device 200, an angle defined by the first slope of the first surface 222 with respect to the top surface of the silicon substrate 250 is less than an angle defined by the second slope of the second surface 223 with respect to the top surface of the silicon substrate 250. Further in this example, the single surface may also be referred to as being substantially a concave surface when viewed from, e.g., the channel region. Still further, the single surface may be referred to as having three inflection points, a first inflection point being located at the beginning of the first slope 222 (at the top surface T of the silicon substrate 250), a second inflection point being at the top of the first slope 222 and the beginning of the second slope 223 and a third inflection point being at the top of the second slope 223 (at the top surface TR of the RESURF oxide 230). In other implementations, additional dielectric layers, with angled portions that have the same, or different angles than those discussed above, may be included in the RESURF oxide 230.

In subsequent processing steps, a gate dielectric may be formed (such as the gate dielectric 125) on the channel region 253 and a gate electrode may be formed (such as the gate polysilicon 126) on the channel region 253 and on at least a portion of the RESURF oxide 230 (e.g., on at least the first surface 222 and the second surface 223). In some embodiments, the gate dielectric may also be disposed on a top surface TR of the RESURF oxide 230. Additionally, a source implant process may be performed in the source region 251 and a drain implant process may be performed in the drain region (not shown). In certain embodiments, these implant processes may include one or more of the same implant steps. In other embodiments, the implant processes may be performed using different implant steps.

FIG. 3 is a table 300 illustrating a comparison of performance parameters for a conventional LDMOS transistor and an LDMOS transistor including a double-sloped field plate, according to an embodiment. In the table 300, a comparison is made between a conventional LDMOS device (including a LOCOS field oxide used as a drift field plate) and an LDMOS device (such as the LDMOS device 100) that includes a double-sloped field plate formed using a RESURF oxide, such as described above with respect to FIGS. 1 and 2. The data shown in the table 300 is normalized and corresponds to a conventional LDMOS device that includes a standard NDD region dopant dose for a given semiconductor process and an LDMOS device with a double-sloped field plate that includes an NDD region dopant dose that is 25% higher than the standard dose for the given semiconductor process.

As shown in FIG. 3, the BVoff for the conventional (Cony.) LDMOS device (with a standard NDD region dose) and the (New) LDMOS device with the double-sloped field plate (with a standard NDD region dose+25%) are comparable, with the BVoff of the LDMOS device with the double-sloped field plate being less than 1% lower than the conventional LDMOS device. As also shown in the table 300, the BVon and the Rdson of the LDMOS device with the double-sloped field plate are substantially improved as compared to the conventional device as a result of a reduction in electric field crowding, as discussed herein. These breakdown voltages may be on the order of 20-50 V (e.g., in the range of 30-40 V). In this example, the BVon is improved by over 13%, while the Rdson is improved by 4.75%. While increasing the NDD dopant dose of the conventional device (e.g., to the same level as the device with the double-sloped field plate) may result in a reduced Rdson for the conventional device, that improvement would result in (likely substantial) reductions of the BVoff and/or BVon, which is undesirable for HV LDMOS devices, such as those described herein.

Figure 4:
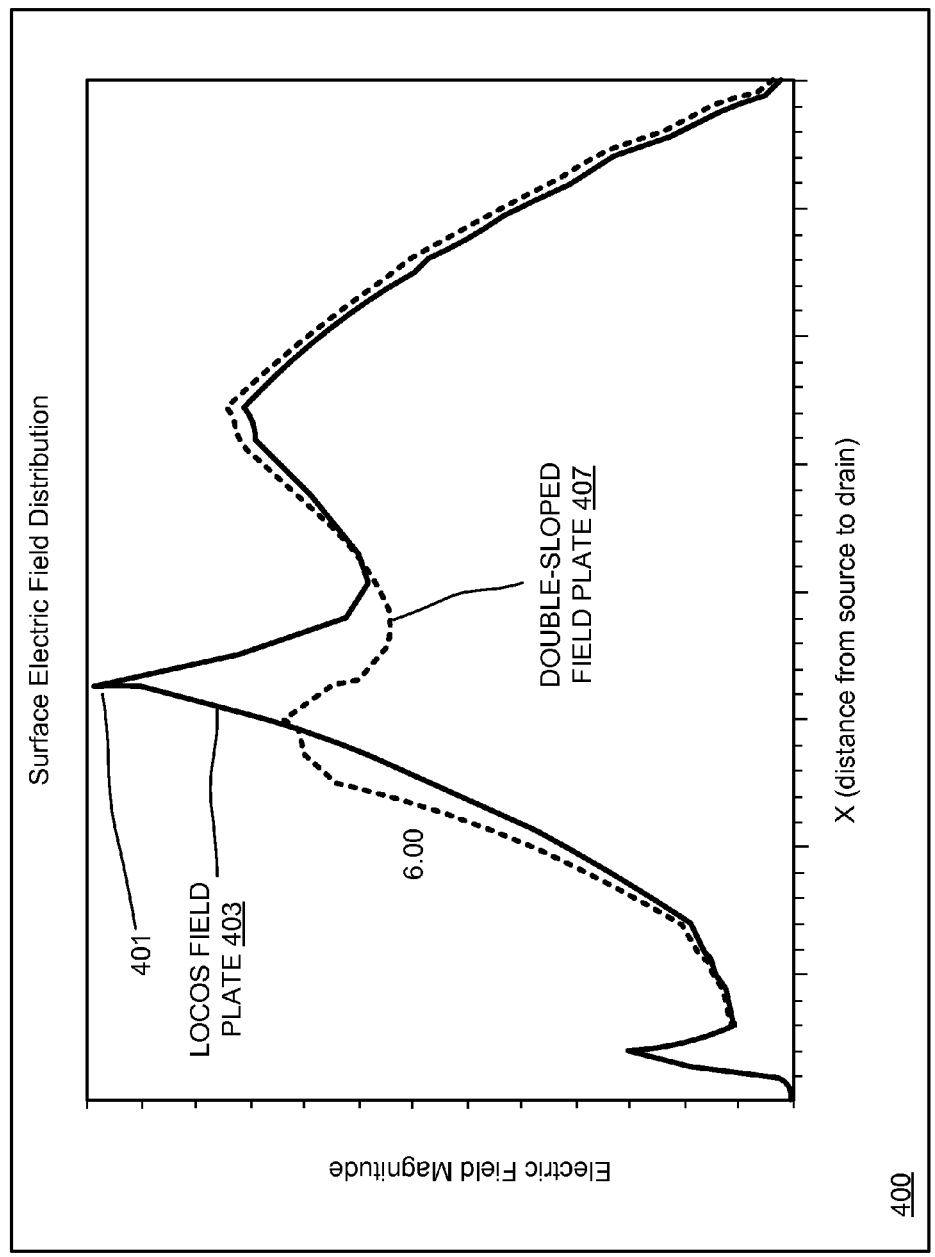
FIG. 4 is a graph that illustrates a comparison of surface electric field along a conduction path for a conventional LDMOS transistor with surface electric field along a conduction path for a LDMOS transistor including a double-sloped field plate, according to an embodiment.

FIG. 4 is a graph 400 that illustrates a comparison of surface electric field (on a top surface of a semiconductor substrate) along a conduction path, e.g., from the source region to the drain region) for a conventional LDMOS transistor with surface electric field along a conduction path for a LDMOS transistor including a double-sloped field plate, such as the LDMOS device 100. For purposes of illustration, the graph 400 will be described with further reference to FIG. 1.

In the graph 400, the normalized value of X, which represents the distance, on the top surface of a semiconductor substrate (e.g., the top surface T in the substrate 150), from a source region 136 (source). These distances will depend on the particular embodiment. For example, in some implementations, the overall distance from source to drain may be on the order 2-5 microns (e.g., 3.3 microns).

In FIG. 4, the curve 403 represents surface electric field distribution along this distance for a conventional LDMOS device with a LOCOS drift field plate. The curve 405 represents surface electric field distribution along this distance for a LDMOS device with a double-sloped drift field plate (the LDMOS 100). As shown in the graph 400 by the curve 403, a peak 401 occurs in the electric field distribution as a result of electric field crowding at an interface between the gate dielectric and the LOCOS drift field plate of the conventional LDMOS device. The breakdown point for such a device will be proximate with the location of this electric field peak on the top surface of a substrate including a corresponding conventional LDMOS device.

In comparison to the curve 403, the curve 405 (corresponding with an LDMOS with a double-sloped drift field plate) does not have an analogous electric field peak at the interface between the gate dielectric and the double-sloped field plate. Accordingly, the breakdown point for such an LDMOS device (e.g., the LDMOS device 100) may be located in the bulk of the device, rather than at the interface between the gate dielectric and the field plate of the device. This reduction in electric field crowding allows for producing HV LDMOS devices with improved Rdson and increased (or comparable) breakdown voltages, as compared with conventional LDMOS devices.

Figure 5A:
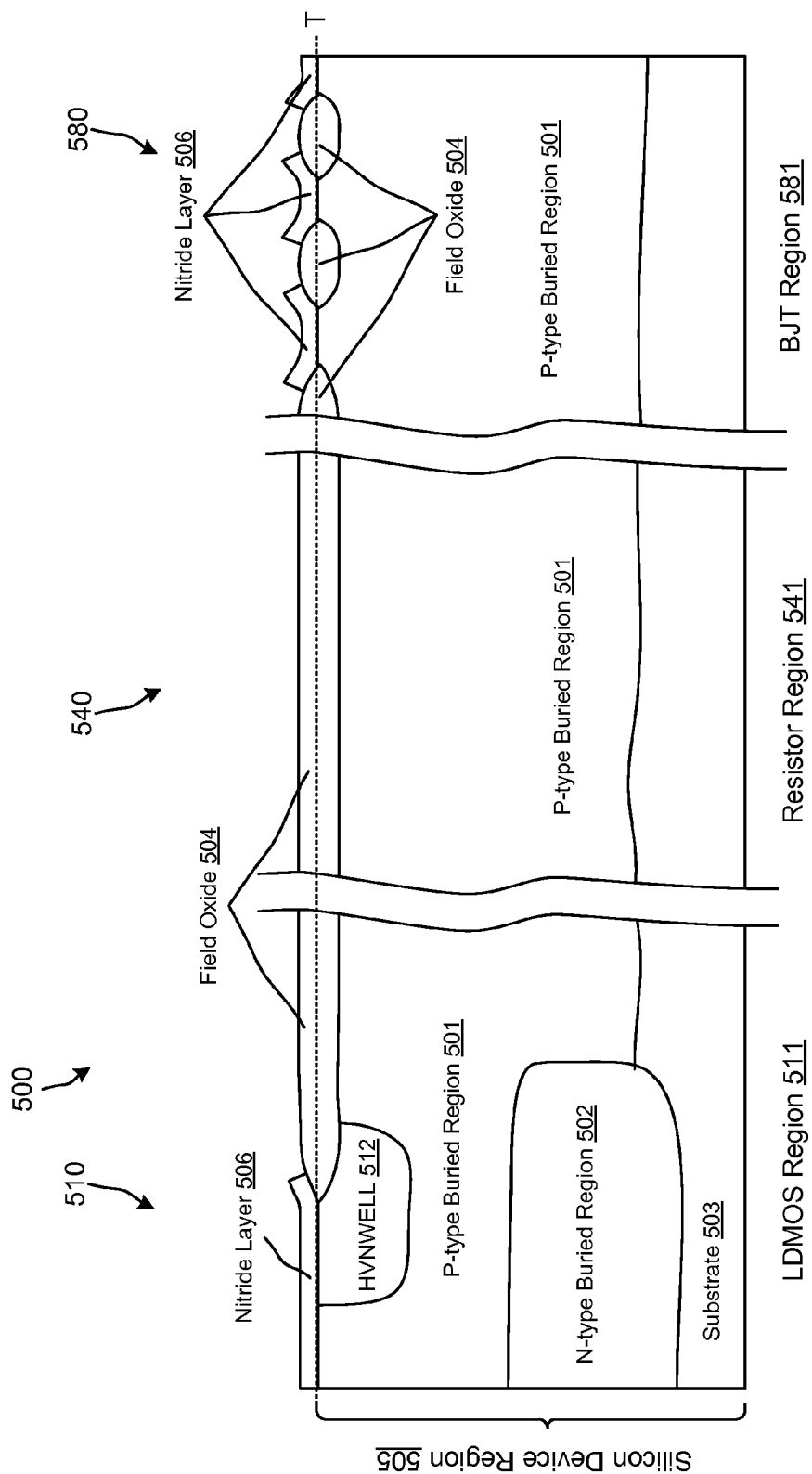
Figure 5D:
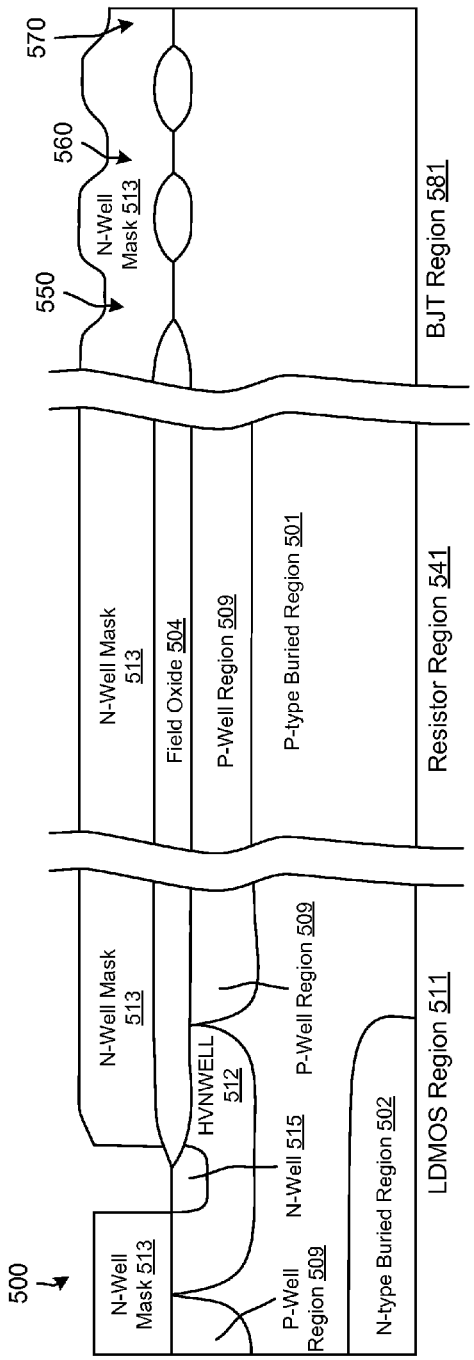
Figure 5E:
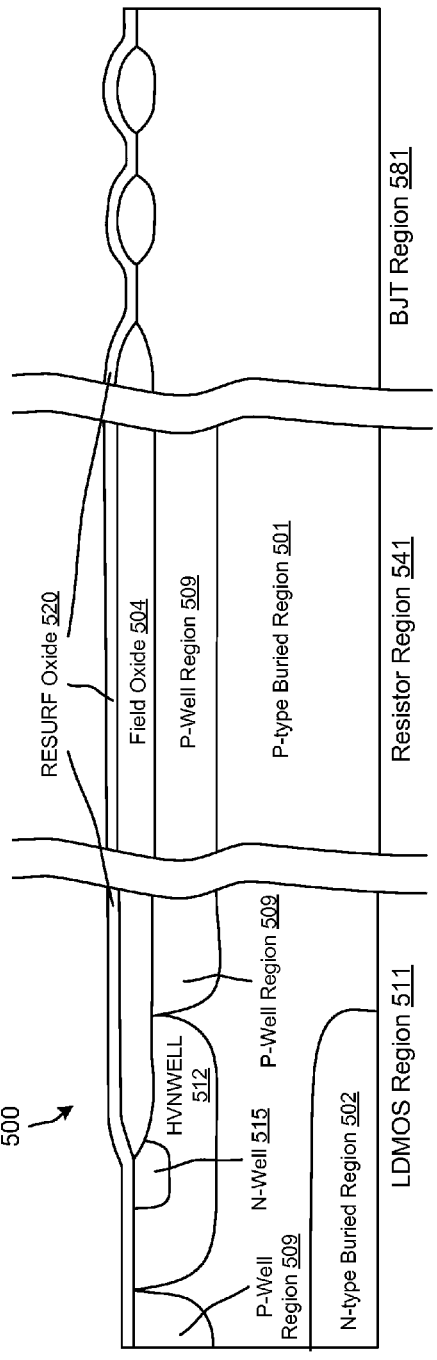
Figure 5G:
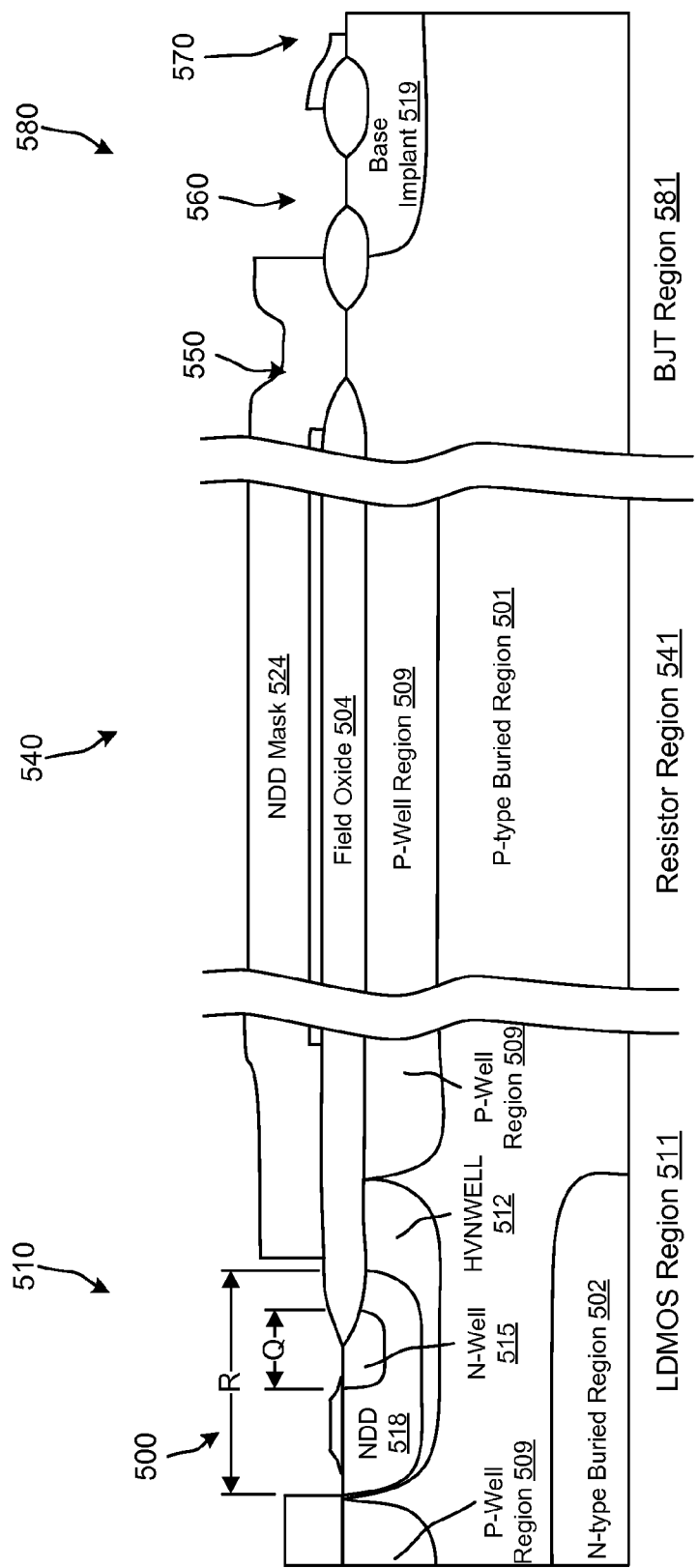
Figure 5H:
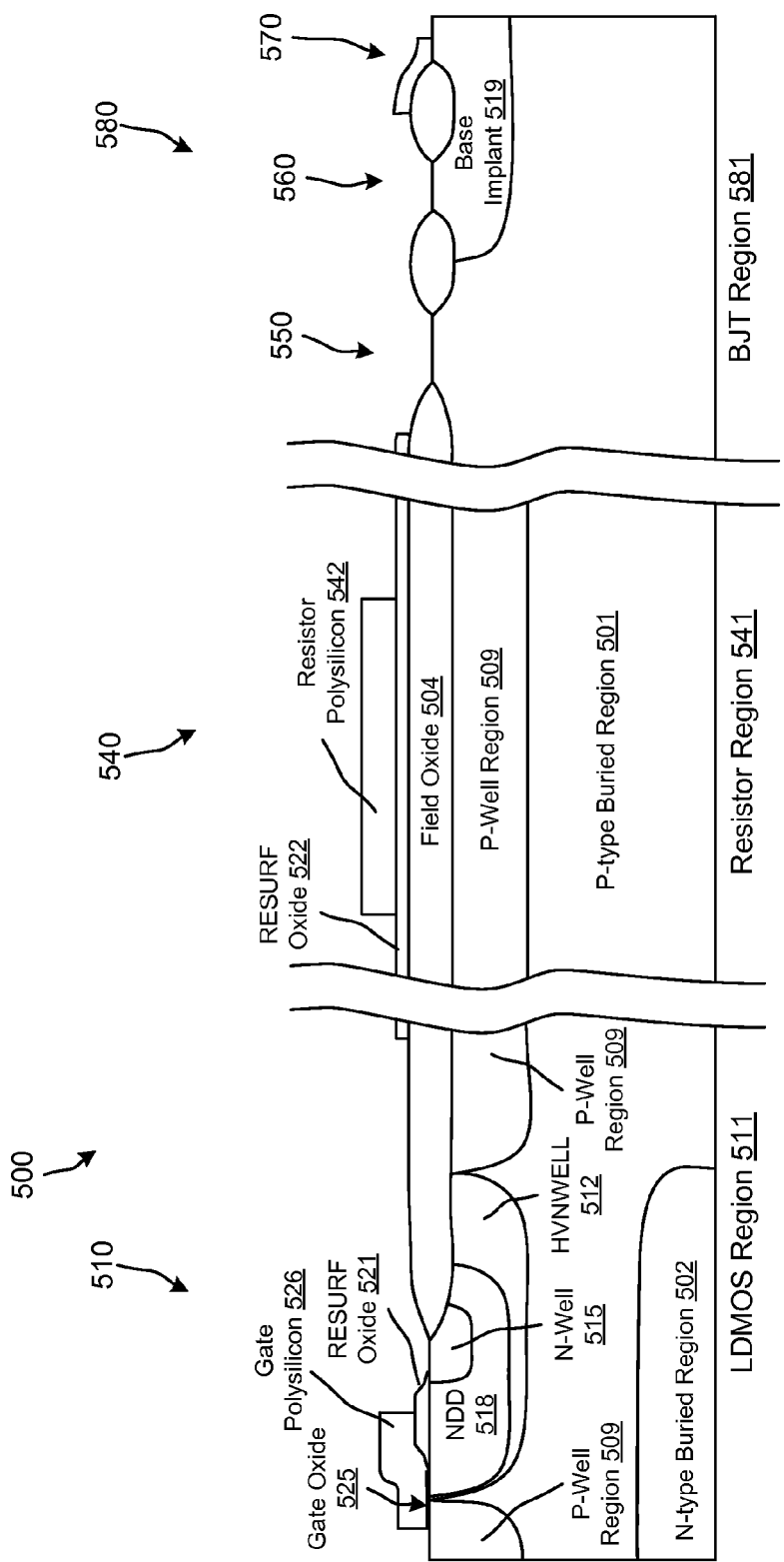
Figure 5I:
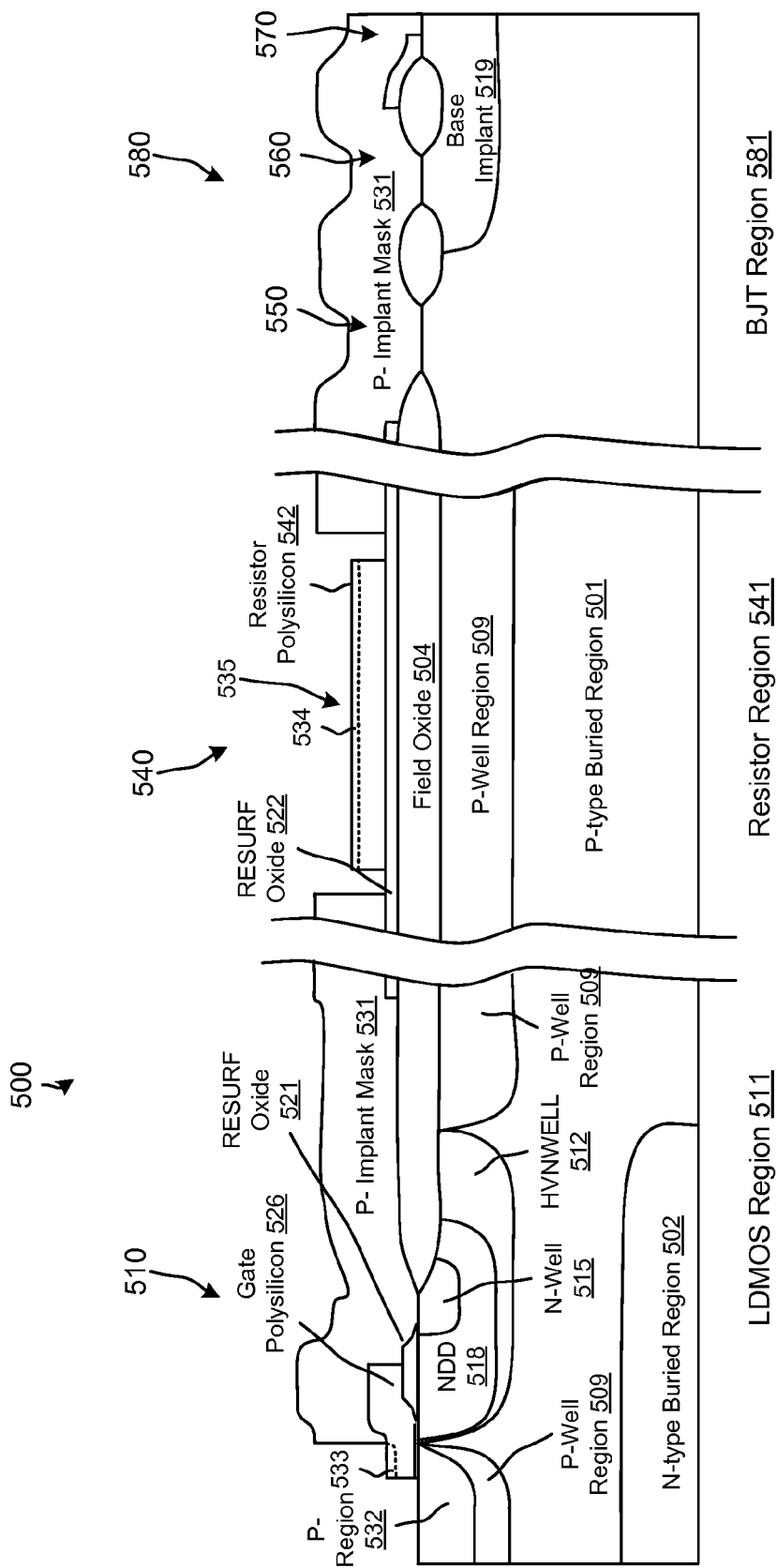
Figure 5J:
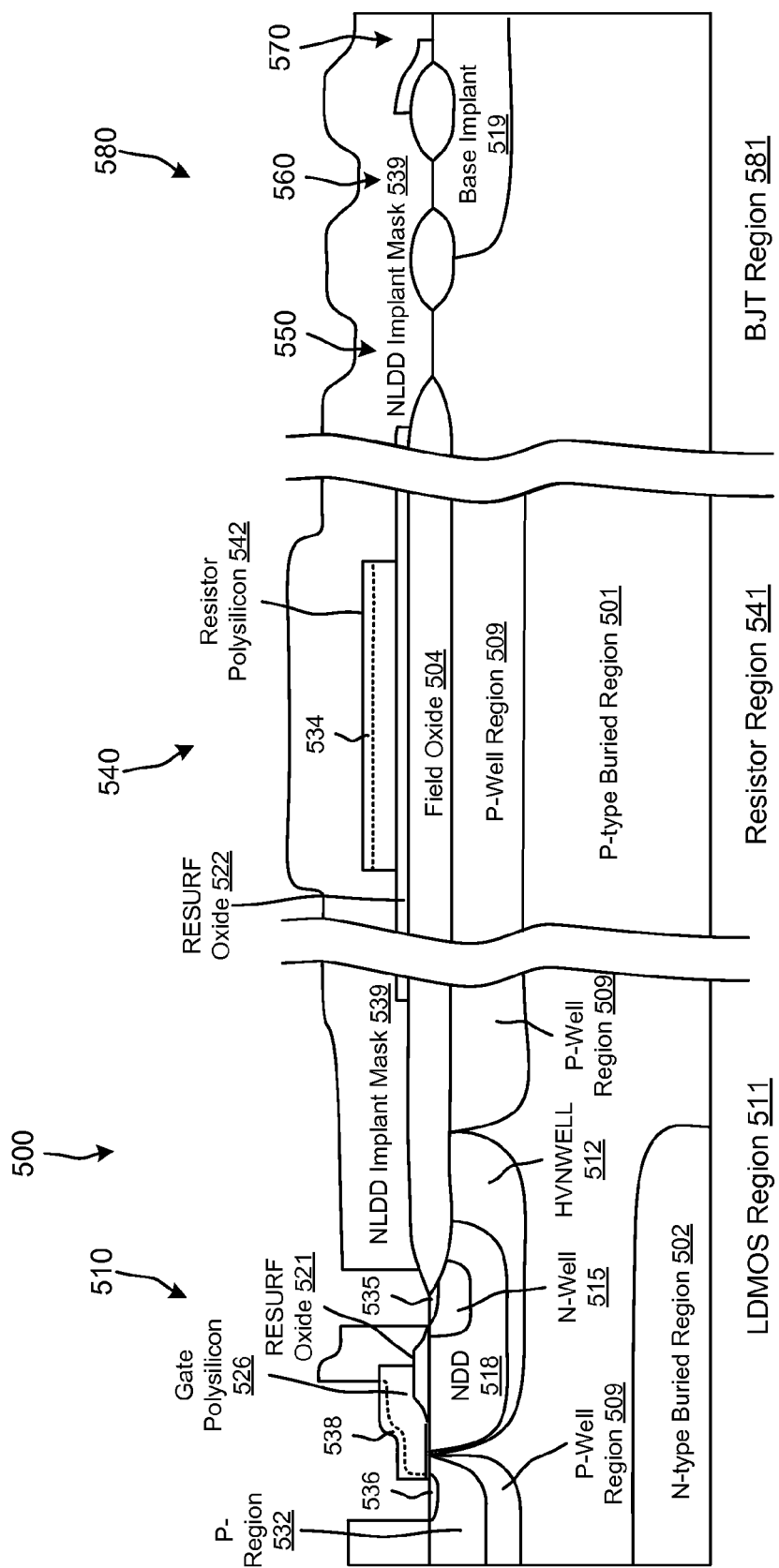
Figure 5K:
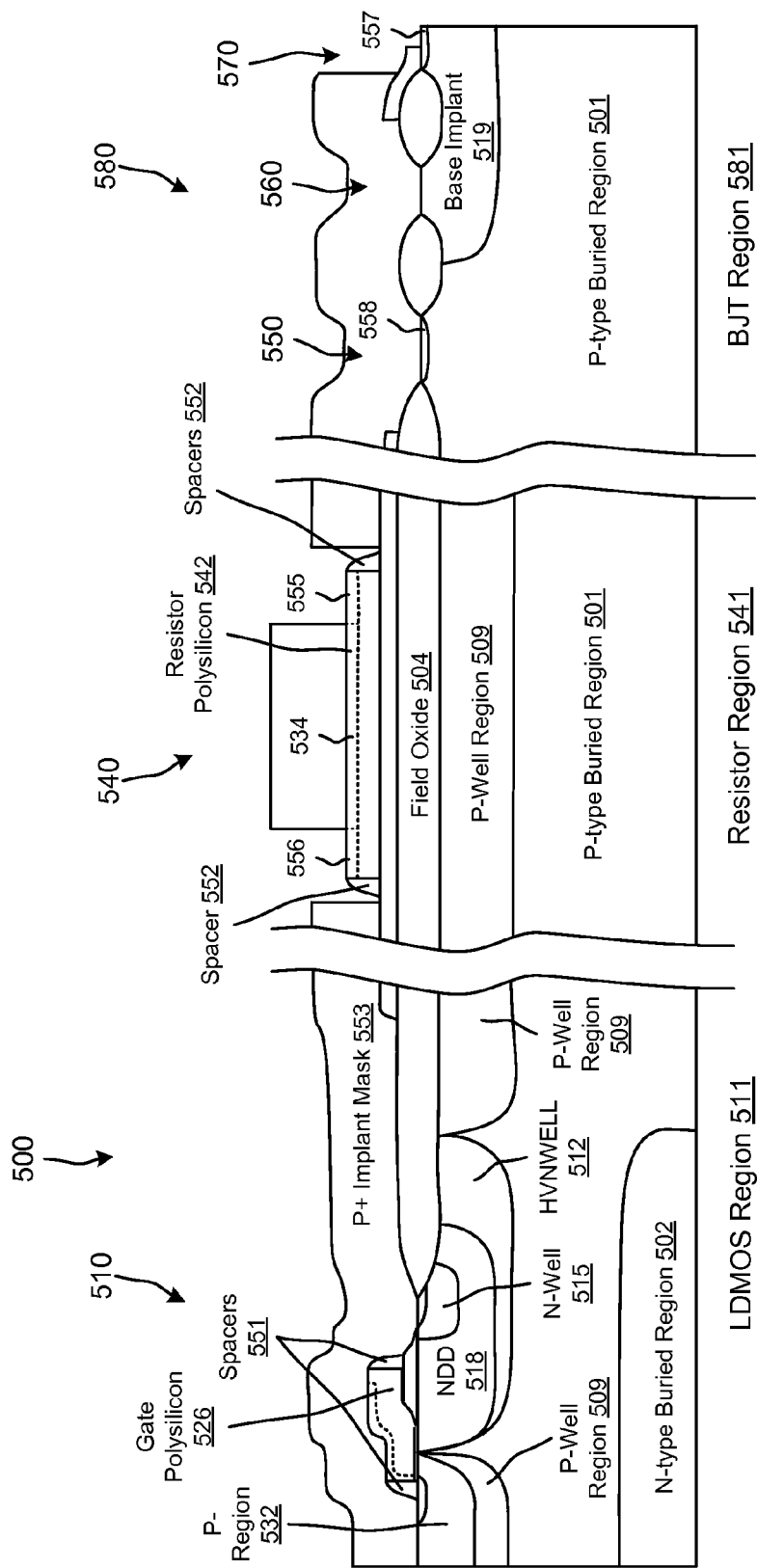
Figure 5L:
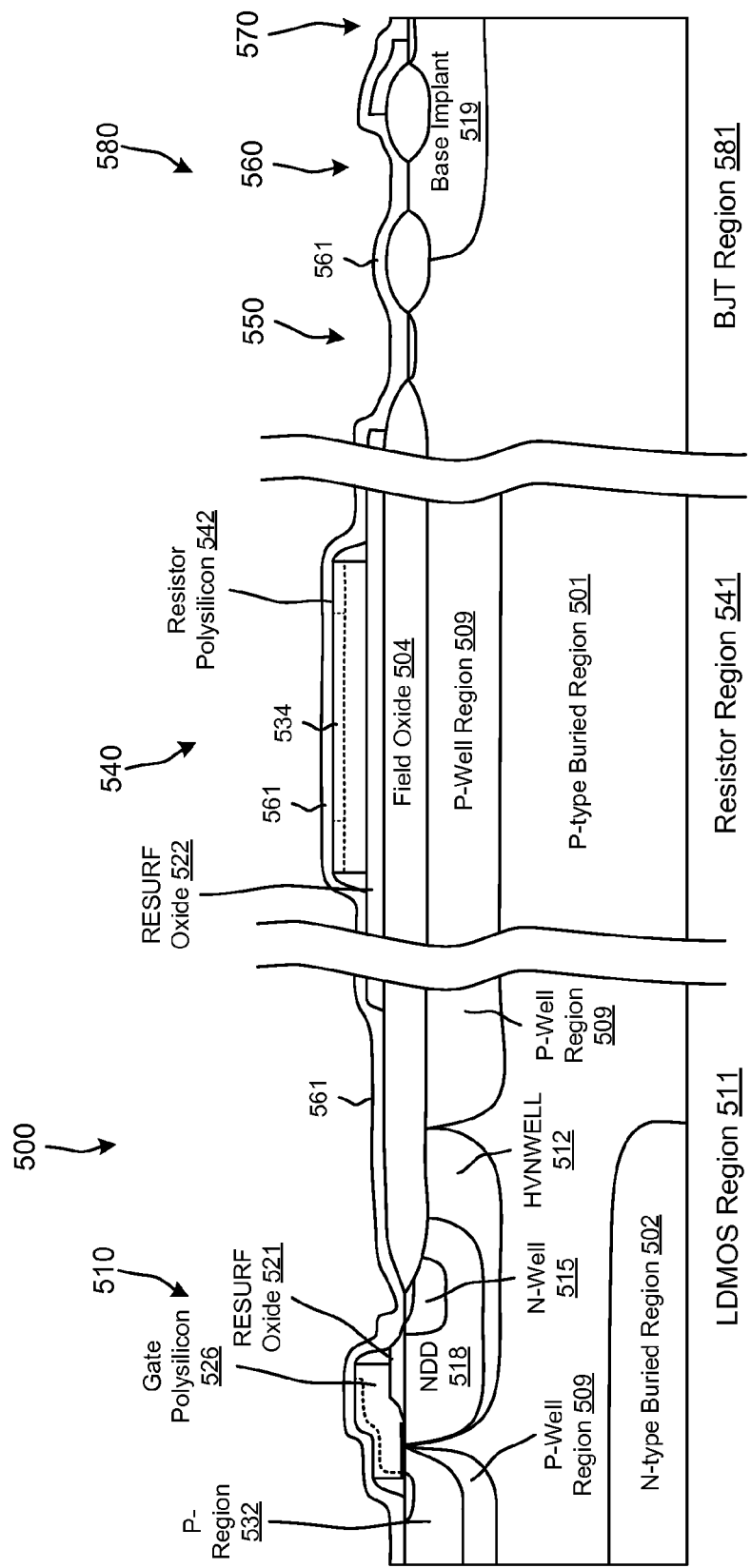
Figure 5M:
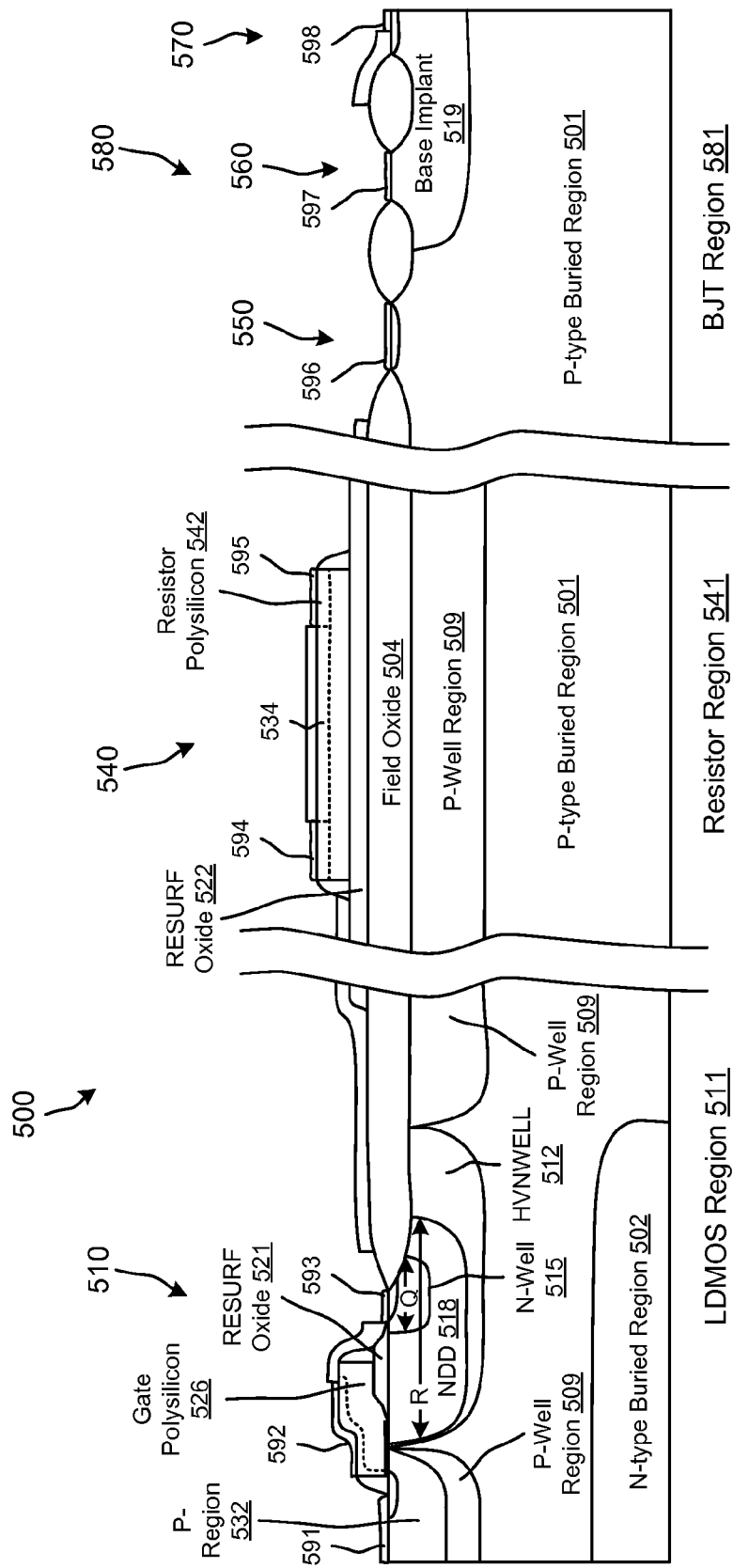

FIGS. 5A through 5M are diagrams that illustrate cross-sectional views of at least some process steps in a semiconductor process that can be used to produce an LDMOS device 510 (e.g., a HV LDMOS device, an LNDMOS device), such as the LDMOS device 100 shown in FIG. 1, a polysilicon resistor 540, and/or a BJT device 580 (each shown as devices in FIG. 5M). Specifically, in this embodiment, portions of the polysilicon resistor 540 and/or the BJT device 580 can be produced using one or more process steps within a semiconductor process overlapping or corresponding with one or more process steps used to produce the LDMOS device 510. The LDMOS device 510, the polysilicon resistor 540, and the BJT device 580 are integrated in a device 500 (also can be referred to as an integrated circuit). The LDMOS device 510 is produced within an LDMOS region 511 of the device 500, the polysilicon resistor 540 is produced within a resistor region 541 of the device 500, and the BJT device 580 is produced within a BJT region 581 of device 500. As shown in FIG. 5M, the BJT device 580 includes a collector 550, a base 560, and an emitter 570.

Although FIGS. 5A through 5M are cross-sectional diagrams that illustrate process steps in a BCDMOS process, the techniques described herein can be applied in a variety of semiconductor processes. The sequence of process steps depicted by the cross-sectional views shown in FIGS. 5A through 5M are given by way of example. Accordingly, various process steps are simplified and/or intermediate process steps are not shown. In some embodiments, at least some of the process steps described herein can be performed in a different order than shown. Also, not all of the elements will be re-labeled with references numerals in each of the figures in order to simplify the figures. In some embodiments, the oxides described herein can include, or can be, any combination of dielectrics including a low-k dielectric, a silicon dioxide, a thermally grown oxide, a deposited oxide, and/or so forth.

As shown in FIG. 5A, the device 500 includes a substrate 503 and an N-type buried region 502 disposed between the substrate 503 and a P-type buried region 501 in the LDMOS region 511. The P-type buried region 501 and the N-type buried region 502 can be formed using a series of process steps including implantation process steps, oxidation process steps epitaxial growth steps, and/or so forth. In some embodiments, at least a portion of the N-type buried region 502 and the P-type buried region 501 can be formed in one or more epitaxial layers (e.g., P-type epitaxial layers) that are serially formed (e.g., formed in a stack fashion, formed above one another during different time periods with intervening process steps or layers). For example, a first P-type epitaxial layer can be formed on the substrate 503 and a second P-type epitaxial layer can be formed on the first P-type epitaxial layer. The epitaxial layers can have thicknesses between approximately 0.5 µm to 3 µm. In some embodiments, one or more of the epitaxial layers can have a thickness less than approximately 0.5 µm or greater than approximately 6 µm. In some embodiments, the epitaxial layers can have different thicknesses.

The epitaxial layer(s), if formed on the substrate 503, and the substrate 503 can collectively be referred to as a silicon device region 505. A top surface T of the silicon device region 505 is illustrated with a dashed line in FIG. 5A. The top surface T of the silicon device region 505 can be a substantially planar top surface T that is horizontally aligned, and a vertical direction can be substantially normal to the top surface T. Although the top surface T and the silicon device region 505 may not be shown in each of the figures, these features are referred to in the subsequent and previous figures.

As shown in FIG. 5A, a high voltage N-well (HVNWELL) region 512 is formed in the P-type buried region 501. In some embodiments, the HVNWELL region 512 can be formed using an HVNWELL photolithography process and an N-type implant process (e.g., an HVNWELL implantation process).

If two epitaxial layers are formed on the substrate 503 with a first epitaxial layer disposed between a second epitaxial layer and the substrate 503, the HVNWELL region 512 can have a depth approximately equal to a depth of the second epitaxial layer, which is disposed on the first epitaxial layer. In some embodiments, the HVNWELL region 512 can have a depth that is less than the depth of the second epitaxial layer, or can have a depth that exceeds the depth of the second epitaxial layer so that at least a portion of the HVNWELL region 512 is disposed in the first epitaxial layer. In some embodiments, at least a portion of the HVNWELL region 512 can be disposed in the substrate 503.

In this embodiment, after the HVNWELL region 512 has been formed, a nitride layer 506 is formed. Portions of the nitride layer 506 are formed in the LDMOS region 511 and portions of the nitride layer 506 are formed in the BJT region 581 (e.g., portions between collector, base, and emitter). The nitride layer 506, in some embodiments, can be a deposited layer, and can be formed using a variety of processing steps including photolithography process steps, etching steps, and/or so forth.

After the nitride layer 506 has been formed, a field oxide 504 is formed. The field oxide 504 can have portions that are in contact with, or disposed below, at least some of the portions of the nitride layer 506. As shown in FIG. 5A, at least a portion of the field oxide 504 can be disposed above the top surface T of the silicon device region 505 and at least a portion of the field oxide 504 can be disposed below the top surface T of the silicon device region 505. In some embodiments, the field oxide 504 can be formed as a local oxidation of silicon (LOCOS) using a LOCOS process. In some embodiments, the field oxide 504 can have a thickness of between 2000 (Angstroms) Å and 7000 Å (e.g., 3000 Å, 4500 Å, 5000 Å). Although not shown in FIG. 5A, in some embodiments, a buffer oxidation, a pad oxidation, sacrificial oxidations and/or so forth can be performed.

FIG. 5B is a cross-sectional diagram illustrating the device 500 after the nitride layer 506 has been removed. After the nitride layer 506 is been removed, a P-well mask 508 (or portions thereof) can be formed on at least some portions of the device 500. Portions of the device 500 that are unmasked with (or exposed through) the P-well mask 508 will be doped with a P-type dopant to form one or more P-well regions 509, which are shown in FIG. 5C. As shown in FIG. 5B, the P-well mask 508 is formed over at least some portions of the LDMOS region 511 and over at least some portions of the BJT region 581. The P-well regions 509 can be formed using a P-well implant in addition to other types of implants including an anti-punch through (APT) implant, an N-type threshold voltage adjust (NVT) implant, a deep isolation implant, and/or so forth. Throughout this description, a mask can be, or can include, a photoresist or other material, such as nitride, for example.

As shown in FIG. 5C, several of the P-well regions 509 are formed in the LDMOS region 511 lateral to the HVNWELL region 512 so that the HVNWELL region 512 is disposed between P-well regions 509 (e.g., disposed between two P-well region 509). Also, as shown in FIG. 5C, the P-well region 509 (e.g., another portion of the P-well region 509) is formed below the field oxide 504 in the resistor region 541. Accordingly, the P-well region 509 has at least a portion disposed between the field oxide 504 and the P-type buried region 501 in the resistor region 541. Although not shown in FIG. 5B, in some embodiments, at least some portions of the P-well mask 508 may be formed on at least some portions of the resistor region 541 so that at least some portions of the P-well region 509 may not be formed below the field oxide 504. In some embodiments, a different type of P-type region can be formed within the P-type buried region 501 of the resistor region 541.

In some embodiments, the P-well implant process used to form the P-well region 509 can be used to form a P-well region in a base of a BJT device (not shown) (e.g., a NPN BJT device). In this embodiment, the P-well implant process used to form the P-well region 509 is not used to form the base 560 of the BJT device 580. In some embodiments, the P-well doping or implant process can be used to form at least a portion of the BJT device 580.

FIG. 5D is a cross-sectional diagram illustrating formation of an N-well mask 513 (or portions thereof) on at least some portions of the device 500. Portions of the device 500 (e.g., the LDMOS region 511) that are unmasked with (or exposed through) the N-well mask 513 will be doped with an N-type dopant to form one or more N-well regions 515. In this embodiment, an N-well region 515 is formed within the HVNWELL region 512 of the LDMOS region 511. The N-well region(s) 515 can be formed using an N-well implant in addition to other types of implants including an APT implant, a P-type threshold voltage adjust (PVT) implant, and/or so forth.

In some embodiments, the N-well implant process used to form the N-well region 515 can be used to form an N-well region in a base of a BJT device (not shown) (e.g., a PNP BJT device). In this embodiment, the N-well implant process used to form the N-well region 515 is not used to form a doped region in the base 560 of the BJT device 580. In other words, the N-well doping or implant process is excluded from the BJT device 580. In some embodiments, the N-well doping or implant process can be used to form at least a portion of the BJT device 580.

As shown in FIG. 5E, a RESURF oxide 520 is formed on the device 500. In some embodiments, the RESURF oxide 520 can be any combination of a thermal oxide and a deposited oxide, such as described herein. In some embodiments, the RESURF oxide 520 can include a thermal oxide layer disposed on a deposited oxide layer, or vice versa. In some embodiments, the thermal oxide can have a thickness of between approximately 10 Å and 1000 Å, and the deposited oxide can have a thickness of between approximately 10 Å and 1500 Å. For example, the RESURF oxide 520 can include a thermal oxide of approximately 200 Å and a deposited oxide of approximately 800 Å. Although not shown in FIG. 5E, in some embodiments, a sacrificial oxide formed on the device 500 can be removed before the RESURF oxide 520 is formed on the device 500.

FIG. 5F is a cross-sectional diagram that illustrates the device 500 after at least some portions of the RESURF oxide 520, which is shown in FIG. 5E, have been removed to form RESURF oxides 521, 522 (or portions of RESURF oxide or a RESURF oxide layer). In some embodiments, portions of the RESURF oxide 520 can be removed using one or more masking processes and/or one or more etching processes, such as described above with respect to FIGS. 2A-2E. As shown in FIG. 5F, at least a portion of the RESURF oxide 522 is disposed on the field oxide 504 in the resistor region 541. Also, at least some portions of the RESURF oxide 523 are disposed on the emitter 570 of the BJT device 580 included in the BJT region 581. Specifically, at least a portion of the RESURF oxide 523 is disposed on an exposed silicon surface (e.g., an exposed silicon surface (e.g., top surface T) of the silicon device region 505) of the emitter 570 in the BJT region 581. Also, although not labeled, a remaining portion of the RESURF oxide 520 is disposed on at least a portion of the collector 550.

Also, as shown in FIG. 5F, a portion of the RESURF oxide 521 (which is derived from RESURF oxide 520) is disposed on an exposed silicon surface (e.g., an exposed silicon surface of the silicon device region 505) of the LDMOS device 510 in the LDMOS region 511. Specifically, a portion of the RESURF oxide 521 is disposed on the HVNWELL region 512 and on the N-well region 515. As illustrated in FIG. 5F (and the subsequent figures), the RESURF oxide 521 has double-sloped end portions, such as described above with respect to FIGS. 1 and 2A-2E, for example. Also, while not shown in FIGS. 5F through 5M, the RESURF oxides 522, 523 can also have double-sloped portions at their ends. The specific configurations of the RESURF oxides 522, 523 depend on the specific implementation.

FIG. 5G is a cross-sectional diagram that illustrates formation of N-type doped drift (NDD) regions 518 concurrently formed with a base implant region 519 within the device 500. Specifically, NDD region 518 is formed in the HVNWELL region 512, and the base implant region 519 is concurrently (e.g., simultaneously) formed in the BJT region 581. The NDD region 518 may be formed using multiple implant operations that are performed at different energies. The NDD region 518 can function as a drift region of the LDMOS device 510 in the LDMOS region 511 and can have an increased drift dose (as compared to a convention LDMOS) device to reduce the Rdson of the LDMOS device 510.

The NDD region 518 and the base implant region 519 are formed using an NDD mask 524, and an N-type implant process (e.g., a single N-type implant process). As shown in FIG. 5G, the N-type implant process used to form the NDD region 518 in the LDMOS device 510 of the LDMOS region 511 is the same N-type implant process used to form the base implant region 519 included in the base 560 of the BJT region 581. Accordingly, as shown in FIG. 5G, during at least the masking step and implanting step for the NDD region 518 (e.g., the n-type drift region), the base 560 and the emitter 570 of the BJT device 580 is also opened (e.g., exposed, unmasked) in the NDD mask 524 (which can be referred to as a drift region mask or drift dose mask) and implanted.

As shown in FIG. 5G, the NDD region 518 and the base implant region 519 each have a depth that is greater than a depth of the N-well region 515. As discussed above, the NDD region 518 and the base implant region 519 can each have a depth that is less than a depth of the N-well region 515. As shown in FIG. 5G, the NDD region 518 and the base implant region 519 have a lateral (or horizontal) width R (from left to right, or vise versa) greater than a lateral (or horizontal) width Q of the N-well region 515.

Although not shown in FIG. 5G, PDD regions can also be formed in a similar fashion for an HVLPDMOS device or HVPMOS device (not shown) and an NPN BJT device (not shown). Such high-voltage P-type devices may be formed using double-sloped field plates, such as those described herein. The P-type implant used for the PDD region of the HVLPDMOS device or HVPMOS device can also be used to dope a base of the NPN BJT device. The PDD region of the HVLPDMOS device or HVPMOS device can function as a drift region of the HVLPDMOS device or HVPMOS device. In other words, in an NPN BJT device (not shown) a p-type drift region implant can be used to dope the NPN BJT device, and a P-well doping or implant can be excluded from at least one NPN BJT device.

As mentioned above, in some embodiments, in addition to BJT devices formed using the drift region implants (e.g., BJT device 580), one or more BJT devices (not shown) can be produced with base implant regions formed using a P-well process (for an NPN BJT device) and one or more BJT devices (not shown) can be produced with base implant regions formed using an N-well process (for an PNP BJT device).

FIG. 5H is a cross-sectional diagram that illustrates formation of polysilicon portions on the device 500. As shown in FIG. 5H, a gate polysilicon 526 (which also can be referred to as a gate electrode) is formed in the LDMOS region 511 and a resistor polysilicon 542 (also can be referred to as a polysilicon portion) is formed in the resistor region 541. In some embodiments, the gate polysilicon 526 and the resistor polysilicon 542 can be formed as part of a polysilicon layer. In some embodiments, the gate polysilicon 526 and the resistor polysilicon 542 can be formed as part of the same polysilicon formation process. In some embodiments, a polysilicon deposition process used to form the gate polysilicon 526 can be the same as a polysilicon deposition process used to form the resistor polysilicon 542. Accordingly, the resistor polysilicon 542 and the gate polysilicon 526 can be concurrently formed, rather than formed using different polysilicon process steps. In some embodiments, the polysilicon deposition process can include one or more masking process steps, one or more etching steps, and/or so forth.

As shown in FIG. 5H, the resistor polysilicon 542 is disposed on the RESURF oxide 522, which is disposed on the field oxide 504. Accordingly, the RESURF oxide 522 and the field oxide 504 are disposed between the resistor polysilicon 542 and the P-well region 509. In this embodiment, the BJT region 581 is excluded from polysilicon formation. Although not shown in FIG. 5H, in some embodiments, the resistor polysilicon 542 can be formed directly on the field oxide 504. In such embodiments, the RESURF oxide 522 may not be formed on (e.g., may be excluded from) at least a portion of the field oxide 504 in the resistor region 541. In other words, in some embodiments, the RESURF oxide 522 may not be disposed between the field oxide 504 and the resistor polysilicon 542.

As shown in FIG. 5H, a gate oxide 525 is formed (e.g., prior to formation of the gate polysilicon 526) below at least a portion of the gate polysilicon 526 (so that the gate oxide 525 is disposed between the gate polysilicon 526 and the top surface T of the silicon device region 505). The area below the gate oxide 525 may be referred to as a channel region of the LDMOS device 510. As shown in FIG. 5H, the gate oxide 525 is in contact with at least a portion of the RESURF oxide 521. Specifically, an end of the gate oxide 525 is in contact with (e.g., abuts, is adjacent to) at least an end of the RESURF oxide 521, such as at a beginning of a first sloped portion of a double-sloped end of the RESURF oxide 521. In some embodiments, the gate oxide 525 can have a thickness between 5 Å and 425 Å (e.g., 50 Å, 120 Å, 200 Å, 300 Å, 400 Å), or thicker. In some embodiments, the gate oxide 525 can have a thickness that is less than a thickness of the RESURF oxide 521.

As shown in FIG. 5H, a boundary (e.g., a left-side boundary as oriented in this figure) of the NDD region 518 intersects (e.g., terminates at) an interface between the top surface T of the silicon device region 505 (which can be a top surface of an epitaxial layer) and a bottom surface of the gate oxide 525 of the LDMOS device 510. In contrast, a boundary (e.g., a left-side boundary as oriented in this figure) of the N-well region 515 can intersect an interface between the top surface T of the silicon device region 505 (which can be a top surface of an epitaxial layer) and a bottom surface of the RESURF oxide 520 of the LDMOS device 510. As shown in FIG. 5H, a boundary of the NDD region 518 (below the gate oxide 525) can be approximately the same as (e.g., corresponds with or is adjacent to) a boundary of the HVNWELL region 512.

As shown in FIG. 5H, the N-well region 515 is disposed within the NDD region 518, which is disposed within the HVNWELL region 512, and the HVNWELL region 512 is disposed between (e.g., laterally between) portions of P-well region 509. Accordingly, the N-well region 515, the NDD region 518, and the HVNWELL region 512 have different cross-sectional areas.

As shown in FIG. 5H, a boundary (e.g., a right-side boundary as oriented in this figure) of the NDD region 518 intersects (e.g., terminates at) an interface between the field oxide 504 and the silicon device region 505. In other words, the boundary (e.g., a right-side boundary as oriented in this figure) of the NDD region 518 terminates at a bottom surface of the field oxide 504. Similarly, a boundary (e.g., a right-side boundary as oriented in this figure) of the N-well region 515 also intersects (e.g., terminates at) an interface between the field oxide 504 and the silicon device region 505. In other words, the boundary (e.g., a right-side boundary as oriented in this figure) of the N-well region 515 terminates at a bottom surface of the field oxide 504. As shown in FIG. 5H, a boundary (e.g., right-side boundary as oriented in this figure) of the NDD region 518 (below the gate oxide 525) does not correspond with (e.g., is separate from) a boundary (e.g., right-side boundary as oriented in this figure) of the N-well region 515 or a boundary (e.g., right-side boundary as oriented in this figure) of the HVNWELL region 512.

FIG. 5I is a cross-sectional diagram that illustrates a P− implant mask 531 used to form P− region 532 (which can be the body region of the LNDMOS device 510) and used to dope at least a portion 533 of the gate polysilicon 526 and a portion 534 of the resistor polysilicon 542. The P− region 532 is disposed within the P− well region 509. A depth of the P− region 532 is less than a depth of the P-well region 509. As shown in FIG. 5I, the implantation process used to dope the P− region 532 is also used to dope a portion 533 of the gate polysilicon 526 and the portion 534 of the resistor polysilicon 542. Accordingly, the portion 534 of the resistor polysilicon 542 can be concurrently doped with the portion 533 of the gate polysilicon 526 and the P− region 532. The doping of the P− region 532 and portions 533, 534 can be a relatively light doping (e.g., lighter in concentration than a concentration of the P-well region 509) performed using a P-type dopant. At least a portion (e.g., a middle portion along a top portion) of the portion 534 can define a resistor body region 535 of the resistor polysilicon 542. In other words, during the LDMOS device 510 body implant, the P-implant mask can be opened (e.g., exposed, unmasked) around the resistor polysilicon 542 so that the resistor polysilicon 542 can be doped. The P− region 532 is disposed within at least one portion of the P-well region 509.

The portion 534 of the resistor polysilicon 542 can include at least some portions of the resistor body region 535 of the resistor polysilicon 542. In some embodiments, the P− implant mask 531 (which can be referred to as a body implant mask) can be formed so that only the resistor body region 535 of the resistor polysilicon 542 is doped. The P− region 532 can have a dopant concentration that is lower than (e.g., an order of magnitude lower than) a dopant concentration of the P-well region 509.

In some embodiments, the resistor polysilicon 542 can be doped with the same implant process (or steps thereof) used to dope the P− region 532 as well as an N-type implant used to dope a source of the LDMOS device 510. In some embodiments, the source implant can be formed during a source/drain (S/D) implantation related to an NMOS process.

FIG. 5J is cross-sectional diagram illustrating N-type lightly doped drain (NLDD) regions 536, 537 formed using an NLDD implant mask 539. As shown in FIG. 5J, at least a portion of the gate polysilicon 526 is also doped during the NLDD implant process. Although not shown in FIG. 5J, a P-type LDD implant can also be performed. In some embodiments, the gate seal oxidation process (not shown) can be performed before an NLDD implant process is performed and/or before a PLDD implant process is performed. As shown in FIG. 5J, the resistor region 541 and the BJT region 581 are excluded from the NLDD implant process. In some embodiments, at least some portions of the resistor region 541 and/or the BJT region 581 can be exposed to the NLDD implant. For example, at least a portion of (e.g., a resistor body region of) the resistor polysilicon 542 can be exposed to the NLDD implant.

As shown in FIG. 5K, a tetraethylorthosilicate (TEOS) deposition process and etch to form spacers 551 for the LDMOS device 510 and spacers 552 for the polysilicon resistor 540 are performed. The spacers 551 and the spacers 552 can be formed using a spacer etch back process.

After the spacers 551, 552 have been formed, each end of the resistor polysilicon 542 is doped with a P+ implant process (which is a type of source implant process and/or drain implant process) using a P+ implant mask 553 (which can be referred to as a source mask and/or as a drain mask) to form P+ regions 555, 556. The P+ implant mask can be associated with a P+ source/drain (S/D) implant of a PMOS device (not shown). The ends (or contact regions) of the resistor polysilicon 542 can be further doped with a P-type dopant so that ohmic (rather than rectifying) contacts can be later form using (or via) the P+ regions 555, 556 of the polysilicon resistor 540. As shown in FIG. 5K, end portions of the resistor polysilicon 542, which have been previously doped, are unmasked with (or exposed through) the P+ implant mask 553 to form the P+ regions 555, 556. In some embodiments, the P+ regions can be referred to as contact regions of the polysilicon resistor 540. The resistor body region 535 (shown in FIG. 5I, for example) can be disposed between the P+ regions 555, 556.

Also, as shown in FIG. 5K, the emitter 570 of the BJT device 580 is doped with the P+ implant to form a P+ region 557 within the base implant region 519. Accordingly, at least some portions of the polysilicon resistor 540 and at least some portions of the BJT device 580 can be concurrently doped with a P+ implantation process associated with a PMOS device. As shown in FIG. 5K, the collector 550 also includes a P+ region 558, In this embodiment, the P+ implant only is shown. In some embodiments, an N+ source/drain implant associated with an NMOS device (not shown) can also be performed. Although not shown in this embodiment, at least some portions of a polysilicon resistor (not shown) and at least some portions of an NPN BJT device (not shown) can be concurrently doped with an N+ implantation process associated with an NMOS device.

After the P+ implant process has been performed, as shown in FIG. 5L, a salicide blocking oxide 561 is formed (e.g., deposited, grown) on the device 500. In some embodiments, the salicide blocking oxide 561 can be referred to as a salicide oxide. The salicide blocking oxide 561 may then be patterned such that the salicide blocking oxide 561 is removed, except in areas of the device 500 where the formation of salicide is not desired, such as the central P− doped portion of the resistor polysilicon 542. After patterning the salicide blocking oxide 561, a metal layer (not shown) may be formed on the device 500. This metal layer may then be reacted (e.g., with silicon in contact with the metal layer) as part of a salicide process. Accordingly, during salicide processing, salicide is formed on the P+ regions 555, 556 of the resistor polysilicon 542, but not formed on the resistor body, central P− doped portion of the resistor polysilicon 542 that is disposed between the P+ regions 555, 556 (which is doped with the LNDMOS P-type body implant).

Similarly, the salicide blocking oxide 561 can be etched (patterned) so that salicide 591, 592, and 593 can be formed, respectively, on the gate, source, and drain of the LDMOS device 510 as shown in FIG. 5M. Also, salicide 594 and 595 can be formed on each end (on the P+ regions 555 and 556, respectively) of the polysilicon resistor 540. Finally, salicide 596, 597, 598, may be formed, respectively, on each of the collector 550, based 560, and emitter 570, of the BJT device 580. Process steps subsequent to formation of salicide, such as contact formation, passivation, metallization, dielectric and via formation, are not shown.

In some embodiments, additional types of semiconductor structures can be included in the device 500. For example, a capacitor device can be formed in the device 500 in addition to the BJT device 580, the polysilicon resistor 540, and the LDMOS device 510.

Figure 6:
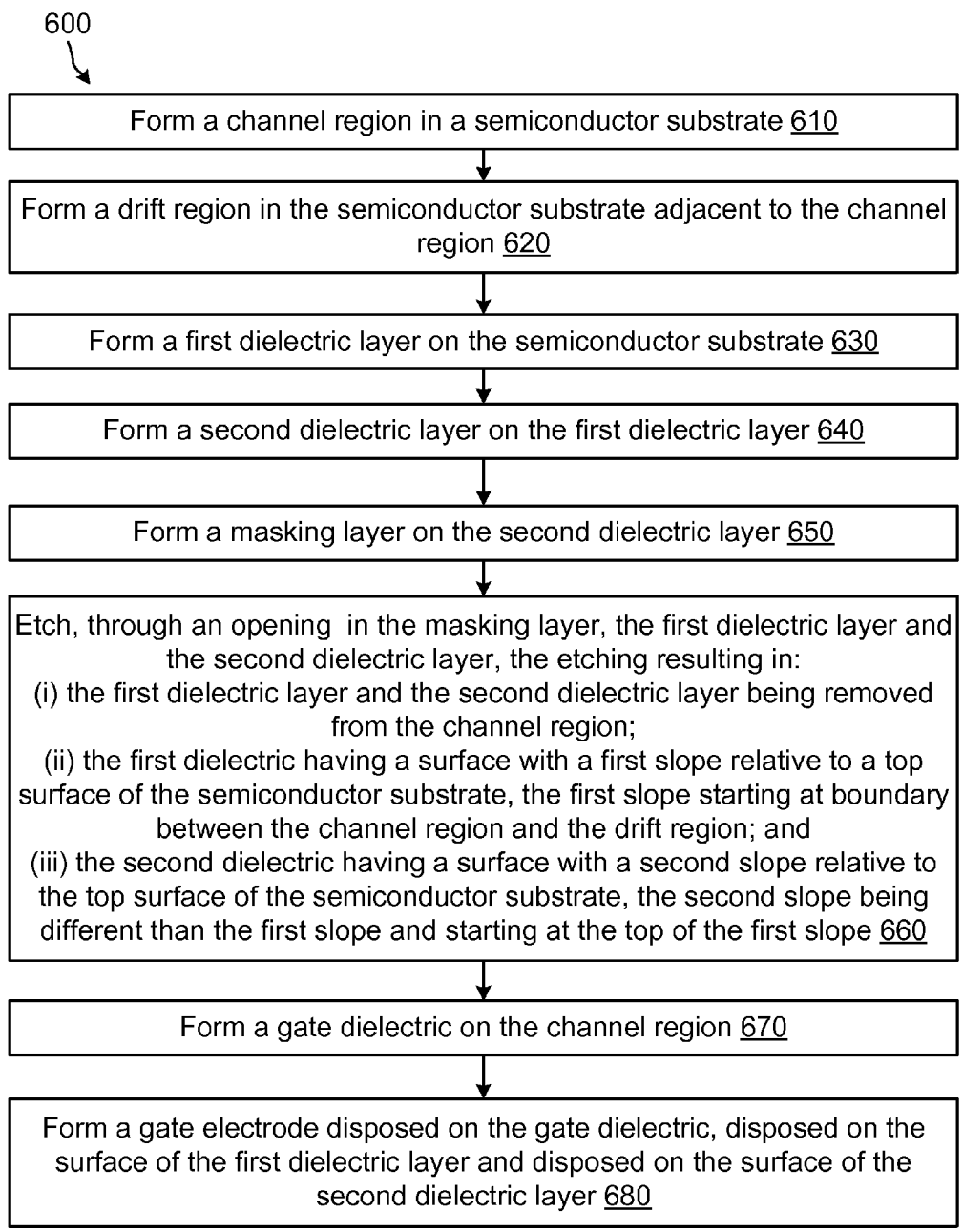
FIG. 6 is a flowchart that illustrates a method of forming a LDMOS device with a double-sloped field plate, according to an embodiment.

FIG. 6 is a flowchart that illustrates a method 600 of forming a LDMOS device with a double-sloped field plate (such as the LDMOS device 100), according to an embodiment. The method 600 may be implemented using the semiconductor processing operations (steps) described herein, such as those operation described with respect FIGS. 2A-2E and 5A-5M, for example. Accordingly, in the following description of the method 600 shown in FIG. 6, further reference will be made to other figures of the disclosure, as appropriate.

The method 600 includes, at block 610, forming a channel region (e.g., of an LDMOS device) in a semiconductor substrate. The channel region of block 610 may be formed using a number of masking, deposition and/or implantation operations, such as those described herein. For instance, in one embodiment, the channel region may be formed, at least in part, using one or more well formation processes, a gate oxidation formation process and a gate polysilicon formation process, such as those discussed above with respect to FIGS. 5A through 5M. In other embodiments, other semiconductor processing operations may be used to form the channel region.

At block 620, the method 600 includes forming a drift region in the semiconductor substrate adjacent to the channel region. The drift region of block 620 may be formed using a number of masking and/or implantation operations, such as those described herein. For instance, in one embodiment, the drift region may be formed, at least in part, using one or more well formation processes and a NDD process, such as those discussed above with respect to FIGS. 5A through 5M. In other embodiments, other semiconductor processing operations may be used to form the drift region.

At block 630, the method 600 includes forming a first dielectric layer on the semiconductor substrate. In one embodiment, the first dielectric layer of block 630 may be a thermally grown oxide layer that is used as a first dielectric layer of a RESURF oxide (e.g., the thermal oxide 230a of the RESURF oxide 230). At block 640, the method 600 includes forming a second dielectric layer on the first dielectric layer. In an example embodiment, the second dielectric layer of block 640 may be a deposited oxide that is used as a second dielectric layer of a RESURF oxide (e.g., the deposited oxide 230b of the RESURF oxide 230).

At block 650, the method 600 includes forming a masking layer on the second dielectric layer. The masking layer of block 650 may be formed using photolithography techniques to form a pattern through which the RESURF oxide is etched (e.g., using a wet BOE) to form a double-sloped end portion (portions) of a field plate (drift region field dielectric plate) disposed over the drift region of block 620. For instance, photoresist may be spun onto a semiconductor substrate wafer and then exposed using ultraviolet light. The exposed portions (or unexposed portions, depending on resist type and or the particular implementation) may then be removed to form the masking layer.

At block 660, the RESURF oxide (the first and second dielectric layers) is etched, through an opening in the masking layer. In the method 600, the etching at block 660 results in the first dielectric layer and the second dielectric layer being removed from the channel region of the LDMOS device. The etching at block 660 also results in the first dielectric having a surface with a first slope relative to a top surface of the semiconductor substrate (e.g., the slope 222), where the first slope starts at boundary between the channel region and the drift region (at one end of a gate dielectric of the LDMOS device). The etching at block 660 further results in the second dielectric having a surface with a second slope relative to the top surface of the semiconductor substrate (e.g., the second slope 223), where the second slope is different than the first slope and starts at the top of the first slope. As discussed herein, the arrangement of, and differences between the first slope and the second slope may be controlled by, one or more of, respective thicknesses of the first and second dielectric layers, respective materials used for the first and second dielectric layers and/or differences in respective etch rates (e.g., for a given etchant) of the first and second dielectric layers.

The method 600 further includes, at block 670, forming a gate dielectric (over the channel region). In certain embodiments, the formation of the gate dielectric of block 670 may be included as part of forming the channel region at block 610. In other embodiments, various semiconductor process steps for forming the channel region of a LDMOS device (including the gate dielectric) may be performed in a number of possible orders.

At block 680, the method 600 includes forming a gate electrode (such as gate polysilicon 126 or gate polysilicon 526), where the gate electrode is disposed on the gate dielectric (of block 670), disposed on the surface of the first dielectric layer (of block 660) and disposed on the surface of the second dielectric layer (of block 660). In certain embodiments, as with the gate dielectric of block 670, the formation of the gate electrode of block 680 may be included as part of forming the channel region at block 610. In other embodiments, various semiconductor process steps for forming the channel region of a LDMOS device (including a gate electrode) may be performed in a number of possible orders.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A laterally diffused metal oxide semiconductor (LDMOS) transistor, comprising:
    a source region disposed in a semiconductor substrate;
    a drain region disposed in the semiconductor substrate;
    a channel region disposed in the semiconductor substrate between the source region and the drain region;
    a drift region disposed in the semiconductor substrate between the channel region and the drain region;
    a field dielectric plate disposed on the semiconductor substrate over at least a portion of the drift region; and
    a gate electrode disposed on at least a portion of the field dielectric plate,
    the field dielectric plate including:
        a first portion having a surface in contact with the gate electrode, the surface of the first portion having a first slope relative to a surface of the semiconductor substrate; and
        a second portion disposed on the first portion and having a surface in contact with the gate electrode, the surface of the second portion having a second slope relative to the surface of the semiconductor substrate, the second slope being different than the first slope.

2. The LDMOS transistor of claim 1, wherein the first slope begins at a boundary between the channel region and the drift region.

3. The LDMOS transistor of claim 1, wherein the second slope begins at a top of the first slope.

4. The LDMOS transistor of claim 1, wherein:
    the first slope is nonparallel with the surface of the semiconductor substrate and is non-orthogonal with the surface of the semiconductor substrate; and
    the second slope is nonparallel with the surface of the semiconductor substrate and is non-orthogonal with the surface of the semiconductor substrate.

5. The LDMOS transistor of claim 1, wherein the first portion of the field dielectric plate includes a first dielectric and the second portion of the field dielectric plate includes a second dielectric.

6. The LDMOS transistor of claim 1, wherein the first portion of the field dielectric plate includes a thermally grown oxide disposed directly on the semiconductor substrate and the second portion of the field dielectric plate includes a deposited oxide disposed directly on the thermally grown oxide.

7. The LDMOS transistor of claim 1, wherein an angle defined by the first slope is less than an angle defined by the second slope.

8. The LDMOS transistor of claim 1, wherein the first portion of the field dielectric plate includes a thermally grown oxide disposed directly on the semiconductor substrate and the second portion of the field dielectric plate includes a deposited oxide disposed directly on the thermally grown oxide, the deposited oxide having an etch rate that is different than an etch rate of the thermally grown oxide for a same etchant.

9. The LDMOS transistor of claim 1, wherein the first portion of the field dielectric plate includes a first dielectric and the second portion of the field dielectric plate includes a second dielectric, the second dielectric having a thickness that is different than a thickness of the first dielectric.

10. The LDMOS transistor of claim 1, wherein:
    the source region, the drain region and the drift region include n-type silicon; and
    the channel region includes p-type silicon.

11. The LDMOS transistor of claim 1, wherein:
    the source region, the drain region and the drift region include p-type silicon; and
    the channel region includes n-type silicon.

12. A laterally diffused metal oxide semiconductor (LDMOS) transistor, comprising:
    a channel region disposed in a semiconductor substrate;
    a gate dielectric disposed on the channel region;
    a drift region disposed in the semiconductor substrate adjacent to the channel region; and
    a field plate having an end portion disposed between a top surface of the semiconductor substrate and the gate dielectric, the end portion having a surface in contact with the gate dielectric, the surface having a first portion aligned along a first plane non-parallel to a second plane along which a second portion of the surface is aligned, the first plane being non-parallel to the top surface of the semiconductor substrate and the second plane being non-parallel to the top surface of the semiconductor substrate.

13. The LDMOS transistor of claim 12, wherein:
    the first portion of the field plate includes a thermally grown oxide; and
    the second portion of the field plate includes a deposited oxide.

14. The LDMOS transistor of claim 12, wherein:
    the first portion of the field plate includes a thermally grown oxide; and
    the second portion of the field plate includes a deposited oxide derived from a tetraethylorthosilicate (TEOS) precursor.

15. The LDMOS transistor of claim 12, wherein:
    the first portion of the field plate includes a thermally grown oxide; and the second portion of the field plate includes a densified, deposited oxide.

16. The LDMOS transistor of claim 12, wherein:
the first portion of the field plate includes a thermally grown oxide; and
the second portion of the field plate includes an undensified, deposited oxide.

17. The LDMOS transistor of claim 12, wherein:
the first plane of the first portion of the surface defines a first angle with respect to the top surface of the semiconductor substrate; and
the second plane of the second portion of the surface defines a second angle with respect to the top surface of the semiconductor substrate,
the first angle being less than the second angle.

* * * * *